US009784766B2

(12) United States Patent
Lindsey et al.

(10) Patent No.: US 9,784,766 B2
(45) Date of Patent: Oct. 10, 2017

(54) DYNAMIC REAL TIME TRANSMISSION LINE MONITOR AND METHOD OF MONITORING A TRANSMISSION LINE USING THE SAME

(71) Applicant: LINDSEY MANUFACTURING COMPANY, Azusa, CA (US)

(72) Inventors: Keith E. Lindsey, La Canada, CA (US); Philip E. Spillane, Torrance, CA (US); An-Chyun Wang, Cerritos, CA (US)

(73) Assignee: LINDSEY MANUFACTURING COMPANY, Azusa, CA (US)

( * ) Notice: Subject to any disclaimer, the term of this patent is extended or adjusted under 35 U.S.C. 154(b) by 229 days.

(21) Appl. No.: 13/796,614

(22) Filed: Mar. 12, 2013

(65) Prior Publication Data
US 2014/0266237 A1   Sep. 18, 2014

(51) Int. Cl.
*G01R 15/14*   (2006.01)
*G01R 31/08*   (2006.01)

(52) U.S. Cl.
CPC ......... *G01R 15/142* (2013.01); *G01R 31/085* (2013.01)

(58) Field of Classification Search
CPC .... G01R 31/08; G01R 31/088; G01R 31/085; G01R 31/086; G01R 15/142; G01M 3/165
USPC ......................................................... 324/512
See application file for complete search history.

(56) References Cited

U.S. PATENT DOCUMENTS

| 4,420,752 A | 12/1983 | Davis et al. |
| 4,589,081 A | 5/1986 | Massa et al. |
| 4,709,339 A | 11/1987 | Fernandes |
| 4,714,893 A | 12/1987 | Smith-Vaniz et al. |
| 4,758,962 A | 7/1988 | Fernandes |
| 4,786,862 A | 11/1988 | Sieron |

(Continued)

FOREIGN PATENT DOCUMENTS

| EP | 2 525 371 A1 | 11/2012 |
| JP | 2007-178240 | 7/2007 |

(Continued)

OTHER PUBLICATIONS

Wikipedia page: http://en.wikipedia.org/wiki/List_of_semiconductor_materials, lasted updated Apr. 27, 2015.*

(Continued)

*Primary Examiner* — Melissa Koval
*Assistant Examiner* — Felicia Farrow
(74) *Attorney, Agent, or Firm* — Lewis Roca Rothgerber Christie LLP

(57) ABSTRACT

A dynamic real time transmission line monitor, a dynamic real time transmission line monitoring system, and a method of dynamic real time transmission line monitoring. A dynamic real time transmission line monitor includes a housing installable on a transmission line, the housing including a base portion, and a cover portion coupled to the base portion and defining a cavity of the housing together with the base portion; a sensor configured to sense in real time at least one of a temperature, a position, a current, an acceleration, a vibration, a tilt, a roll, or a distance to a nearest object; and an antenna in the cavity of the housing and configured to transmit a signal including information sensed by the sensor away from the monitor in real time.

33 Claims, 17 Drawing Sheets

(56) References Cited

U.S. PATENT DOCUMENTS

| | | | |
|---|---|---|---|
| 4,799,005 A | 1/1989 | Fernandes | |
| 4,801,937 A | 1/1989 | Fernandes | |
| 4,808,916 A | 2/1989 | Smith-Vaniz | |
| 4,818,990 A | 4/1989 | Fernandes | |
| 4,829,298 A | 5/1989 | Fernandes | |
| 4,843,372 A | 6/1989 | Savino | |
| 4,855,671 A | 8/1989 | Fernandes | |
| 4,886,980 A | 12/1989 | Fernandes et al. | |
| 4,902,976 A * | 2/1990 | Belshaw | E21B 47/0905 324/346 |
| 4,904,996 A | 2/1990 | Fernandes | |
| 4,961,644 A | 10/1990 | Marsden | |
| 5,029,101 A | 7/1991 | Fernandes | |
| 5,132,968 A | 7/1992 | Cephus | |
| 5,140,257 A | 8/1992 | Davis | |
| 5,341,088 A | 8/1994 | Davis | |
| 5,351,032 A | 9/1994 | Latorre et al. | |
| 5,372,207 A | 12/1994 | Naville et al. | |
| 5,550,476 A | 8/1996 | Lau et al. | |
| 5,565,783 A * | 10/1996 | Lau | G01R 15/142 324/127 |
| 5,818,821 A | 10/1998 | Schurig | |
| 5,892,430 A | 4/1999 | Wiesman et al. | |
| 5,898,558 A | 4/1999 | Ostendorp | |
| 6,048,095 A | 4/2000 | Shindo et al. | |
| 6,167,525 A | 12/2000 | Donazzi et al. | |
| 6,201,711 B1 * | 3/2001 | Cherniski et al. | 361/800 |
| 6,205,867 B1 | 3/2001 | Hayes et al. | |
| 6,333,975 B1 | 12/2001 | Brunn et al. | |
| 6,523,424 B1 | 2/2003 | Hayes et al. | |
| 6,677,743 B1 | 1/2004 | Coolidge et al. | |
| 6,794,991 B2 | 9/2004 | Dungan | |
| 6,845,333 B2 | 1/2005 | Anderson et al. | |
| 6,965,302 B2 | 11/2005 | Mollenkopf et al. | |
| 6,965,303 B2 | 11/2005 | Mollenkopf | |
| 6,965,320 B1 | 11/2005 | Casey et al. | |
| 7,053,770 B2 | 5/2006 | Ratiu et al. | |
| 7,202,797 B2 | 4/2007 | Zhavi | |
| 7,282,944 B2 | 10/2007 | Gunn et al. | |
| 7,304,976 B2 | 12/2007 | Mao et al. | |
| 7,369,045 B2 * | 5/2008 | Hansen | H02J 13/0075 333/24 R |
| 7,557,563 B2 * | 7/2009 | Gunn et al. | 324/127 |
| 7,626,508 B2 | 12/2009 | Kosuge et al. | |
| 7,701,325 B2 | 4/2010 | White, II | |
| 7,714,735 B2 | 5/2010 | Rockwell | |
| 7,733,094 B2 | 6/2010 | Bright et al. | |
| 7,764,169 B2 | 7/2010 | Rowell et al. | |
| 7,786,894 B2 | 8/2010 | Polk et al. | |
| 8,275,570 B2 | 9/2012 | Rousselle | |
| 2002/0019725 A1 | 2/2002 | Petite | |
| 2003/0162539 A1 | 8/2003 | Fiut et al. | |
| 2004/0054921 A1 | 3/2004 | Land, III | |
| 2004/0071185 A1 | 4/2004 | Syracuse et al. | |
| 2005/0017751 A1 | 1/2005 | Gunn et al. | |
| 2005/0231387 A1 | 10/2005 | Markelz | |
| 2006/0077918 A1 | 4/2006 | Mao et al. | |
| 2006/0187017 A1 | 8/2006 | Kulesz et al. | |
| 2007/0002771 A1 | 1/2007 | Berkman et al. | |
| 2007/0116403 A1 | 5/2007 | Blemel | |
| 2007/0152808 A1 | 7/2007 | LaCasse | |
| 2008/0024321 A1 * | 1/2008 | Polk et al. | 340/870.07 |
| 2008/0208532 A1 | 8/2008 | Blemel | |
| 2008/0228294 A1 | 9/2008 | Nielsen et al. | |
| 2008/0297162 A1 | 12/2008 | Bright et al. | |
| 2009/0015239 A1 * | 1/2009 | Georgiou et al. | 324/105 |
| 2009/0167522 A1 | 7/2009 | Coty et al. | |
| 2009/0187285 A1 | 7/2009 | Yaney et al. | |
| 2009/0268553 A1 | 10/2009 | Ecker et al. | |
| 2010/0033345 A1 | 2/2010 | Polk et al. | |
| 2010/0214183 A1 * | 8/2010 | Stoneback et al. | 343/705 |
| 2011/0010118 A1 * | 1/2011 | Gaarder | 702/60 |

FOREIGN PATENT DOCUMENTS

| | | | | |
|---|---|---|---|---|
| RU | | 99455 U1 | 11/2010 | |
| WO | WO 2004/038891 | A2 | 5/2004 | |
| WO | WO 2007/031435 | A1 | 3/2007 | |
| WO | WO 2012045287 | A1 * | 4/2012 | G01R 15/181 |

OTHER PUBLICATIONS

Patent Abstracts of Japan and Machine English Translation of JP 2007-178240 (24 pages).
International Search Report and Written Opinion dated Dec. 9, 2011 for International Application No. PCT/US2011/046334 (16 sheets).
Notice of Intent to Issue Ex Parte Reexamination Certificate and Interview Summary for U.S. Appl. No. 90/012,655, dated Dec. 3, 2013 (13 pages).
Advisory Action for Ex Parte Reexamination for U.S. Appl. No. 90/012,655, dated Oct. 23, 2013, (17 pages).
Final Office Action for Ex Parte Reexamination for U.S. Appl. No. 90/012,655, dated Aug. 6, 2013, 2012 (92 pages).
Final Office Action for U.S. Appl. No. 12/572,141, dated Jul. 3, 2013 (25 pages).
Non-Final Office Action for Ex Parte Reexamination for U.S. Appl. No. 90/012,655, dated Mar. 14, 2013 (28 pages).
Office Action for U.S. Appl. No. 12/572,141, dated Jan. 30, 2013 (20 pages).
Order Granting Ex Parte Reexamination for U.S. Appl. No. 90/012,655, mailed Dec. 12, 2012 (22 pages).
Advisory Action for U.S. Appl. No. 12/572,141, dated Apr. 7, 2011 (3 pages).
Final Office Action for U.S. Appl. No. 12/572,141, dated Jan. 26, 2011 (10 pages).
Office Action for U.S. Appl. No. 12/572,141, dated Aug. 23, 2010 (18 pages).
Notice of Allowance for U.S. Appl. No. 11/425,287, dated Feb. 25, 2010 (7 pages).
Advisory Action for U.S. Appl. No. 11/425,287, dated Jan. 25, 2010 (3 pages).
Final Office Action for U.S. Appl. No. 11/425,287, dated Nov. 9, 2009 (10 pages).
Office Action for U.S. Appl. No. 11/425,287, dated May 22, 2009 (27 pages).
Final Office Action for U.S. Appl. No. 11/425,287, dated Dec. 10, 2008 (9 pages).
Office Action for U.S. Appl. No. 11/425,287, dated Jul. 1, 2008 (10 pages).
International Search Report and Written Opinion for corresponding PCT Application No. PCT/US2014/024825, dated Dec. 19, 2014 (8 pages).
Rospatent Office Action dated Apr. 8, 2016 for corresponding Russian Patent Application No. 2015114578, with English Translation (13 sheets).
Supplementary European Search Report for corresponding European Application No. 14778783.2, Supplementary European Search Report dated Oct. 21, 2016 and mailed Nov. 4, 2016 (8 pgs.).
M. Fuchs, C.B. Tanner, "Infrared Thermometry of Vegetation", Agronomy Journal, vol. 58, N6, 1966 (pp. 597-601).
Office action dated Jun. 2, 2017 from corresponding Russian application No. 2015114578 in the name of Lindsey Manufacturing Company, with English translation (18 pgs.).

* cited by examiner

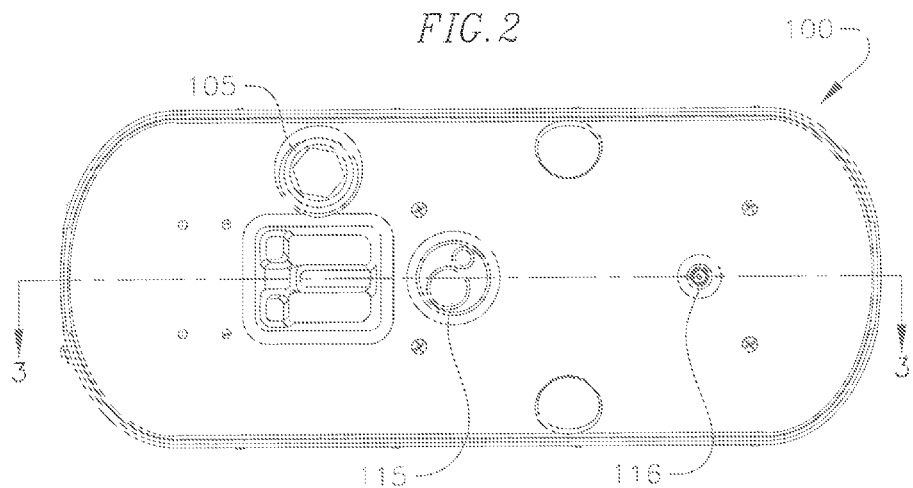
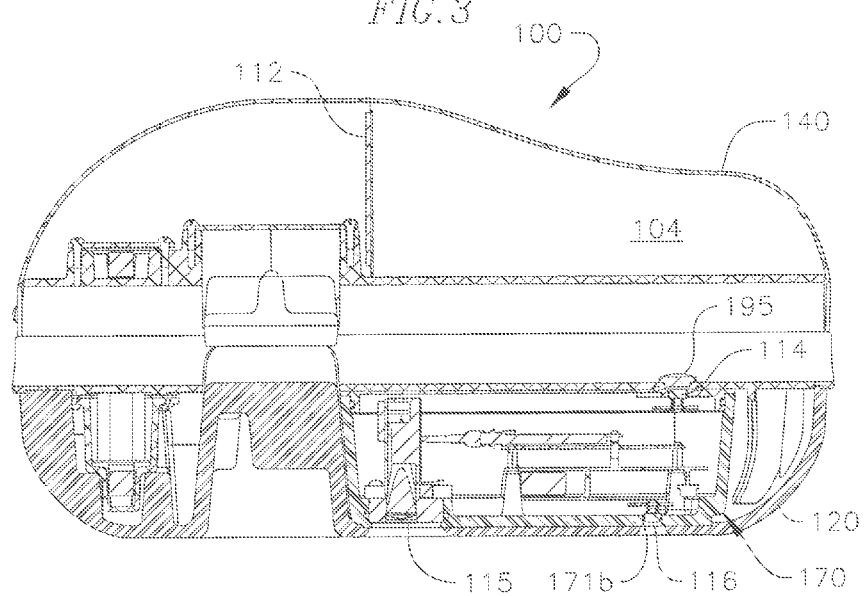

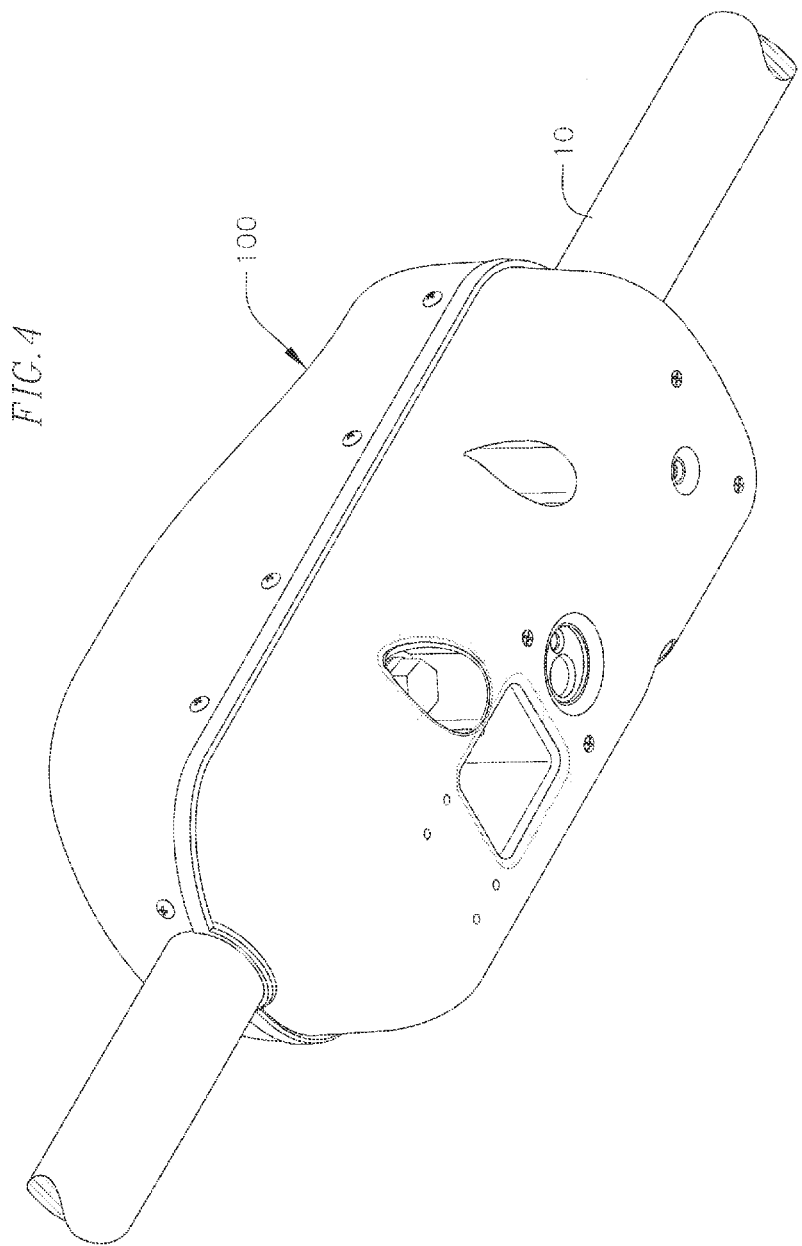

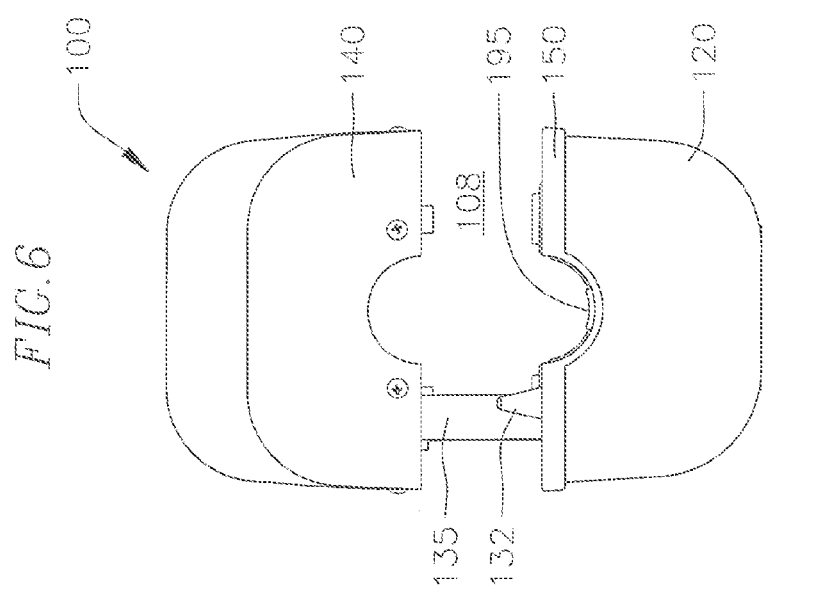
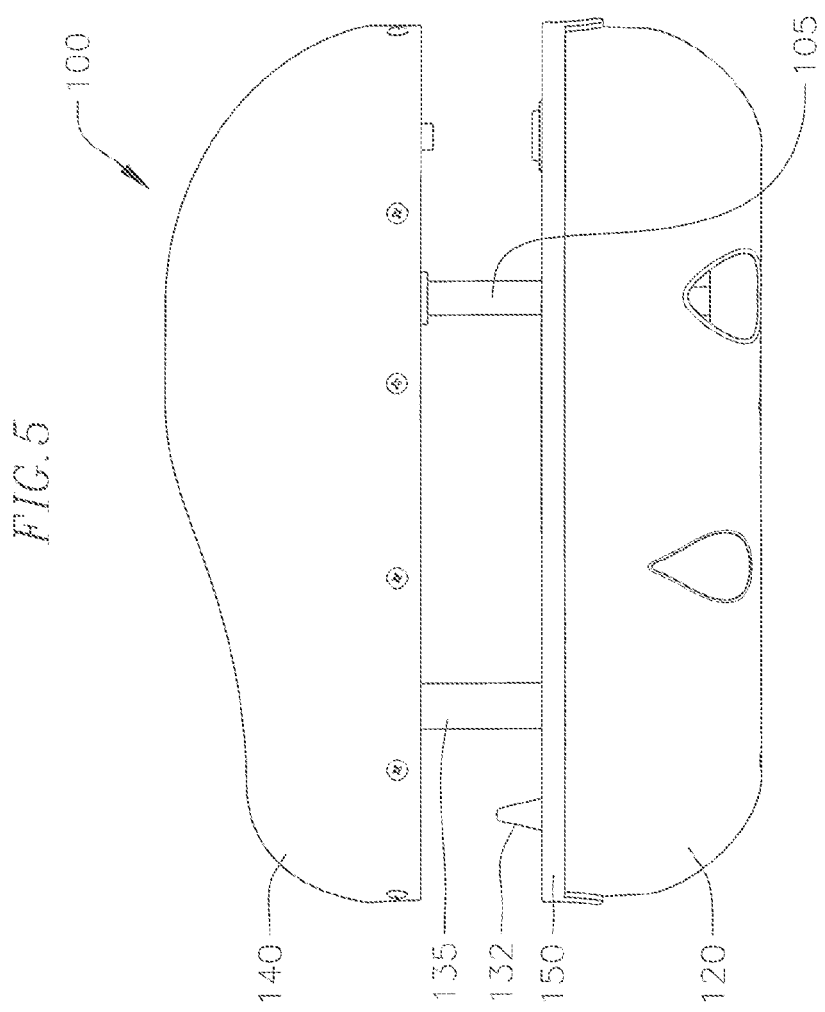

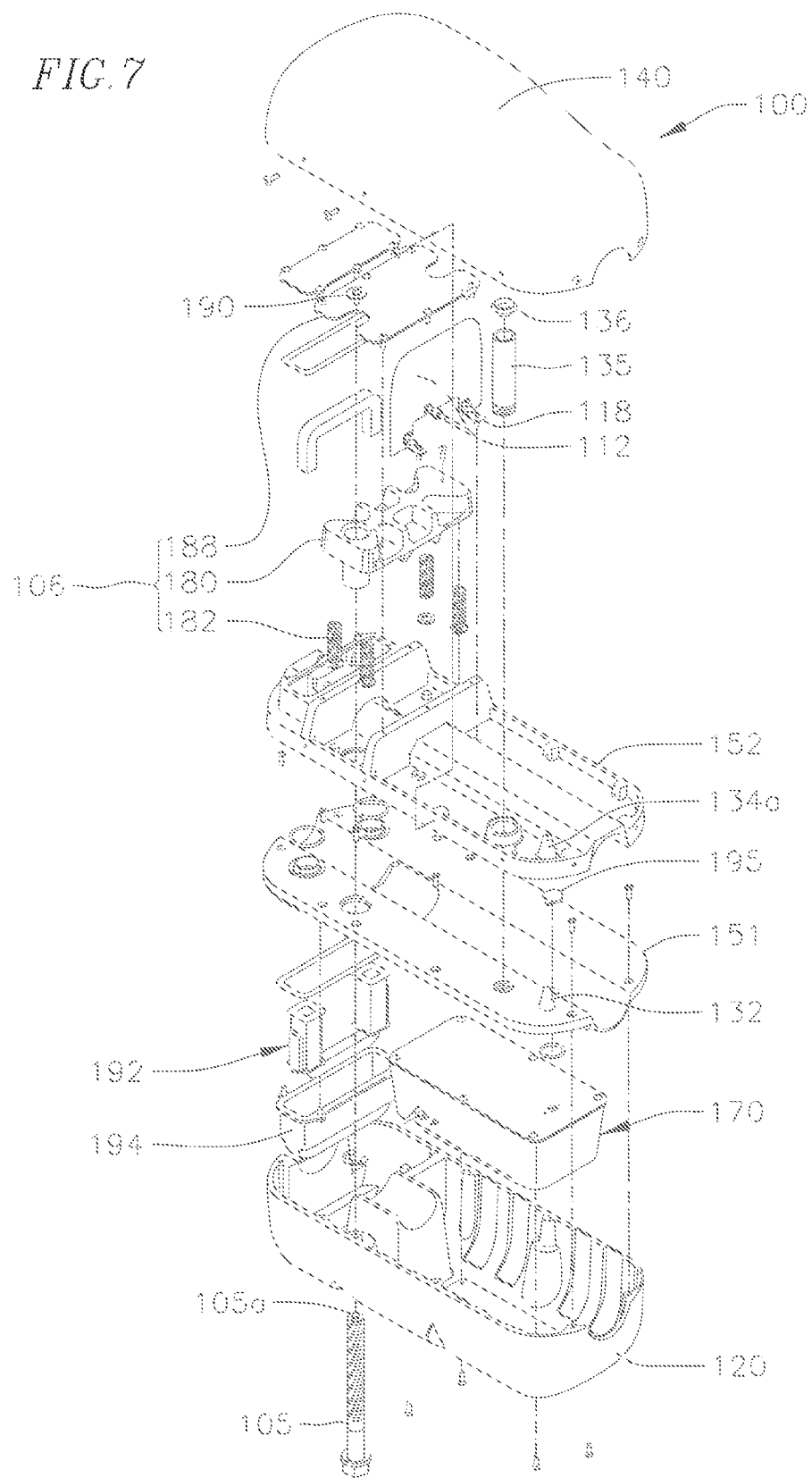

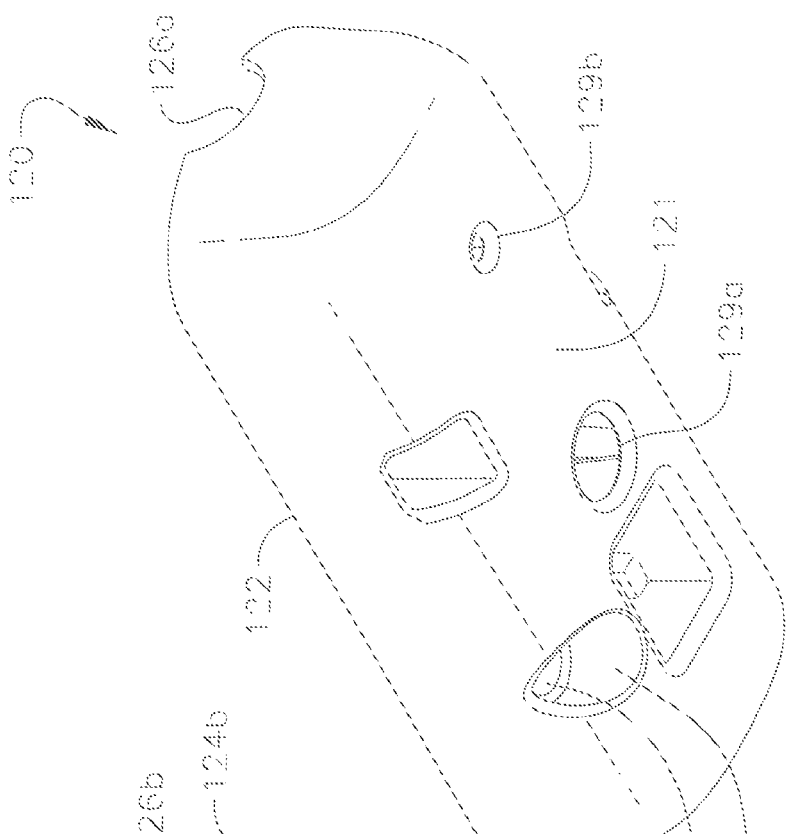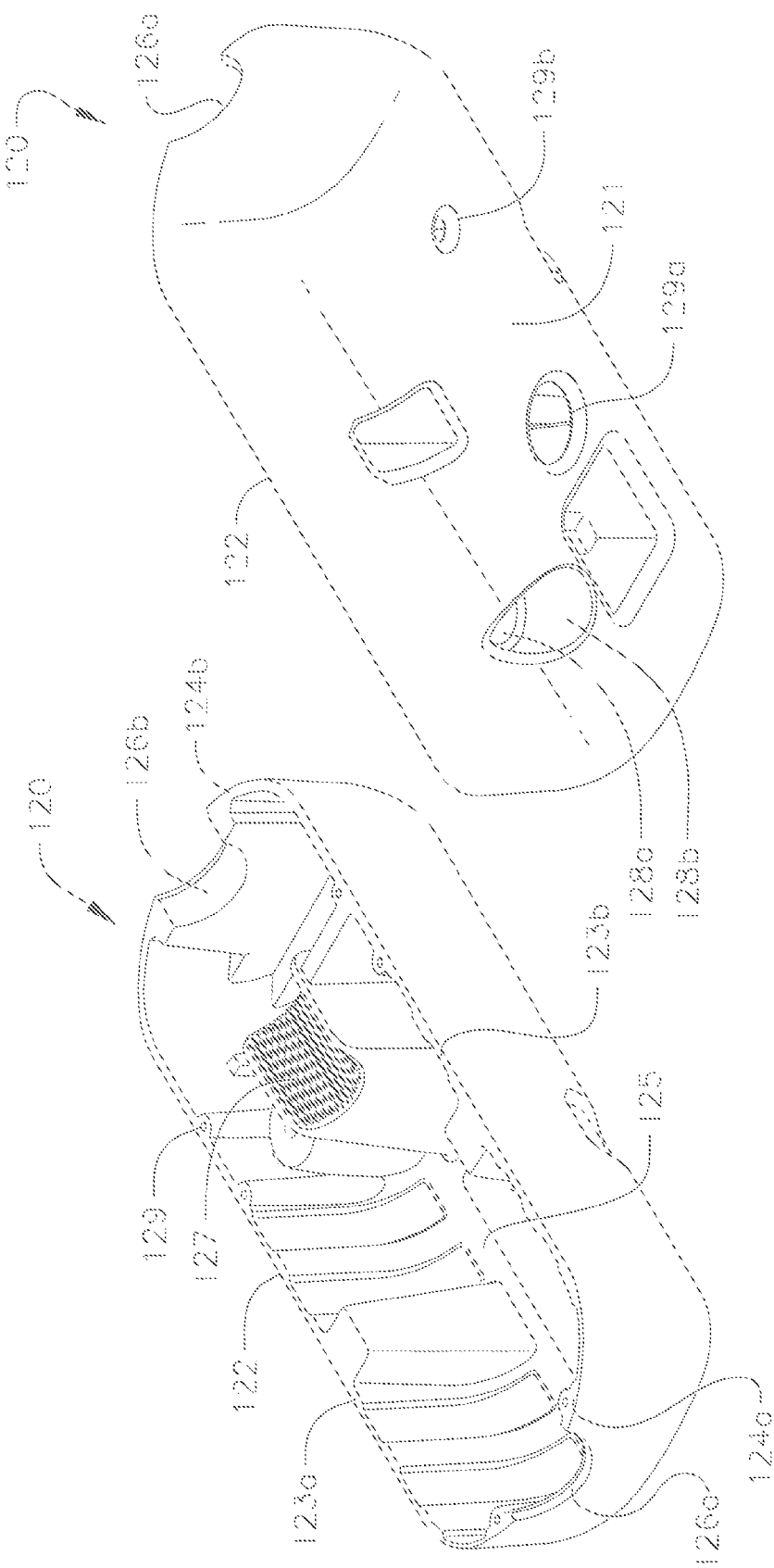

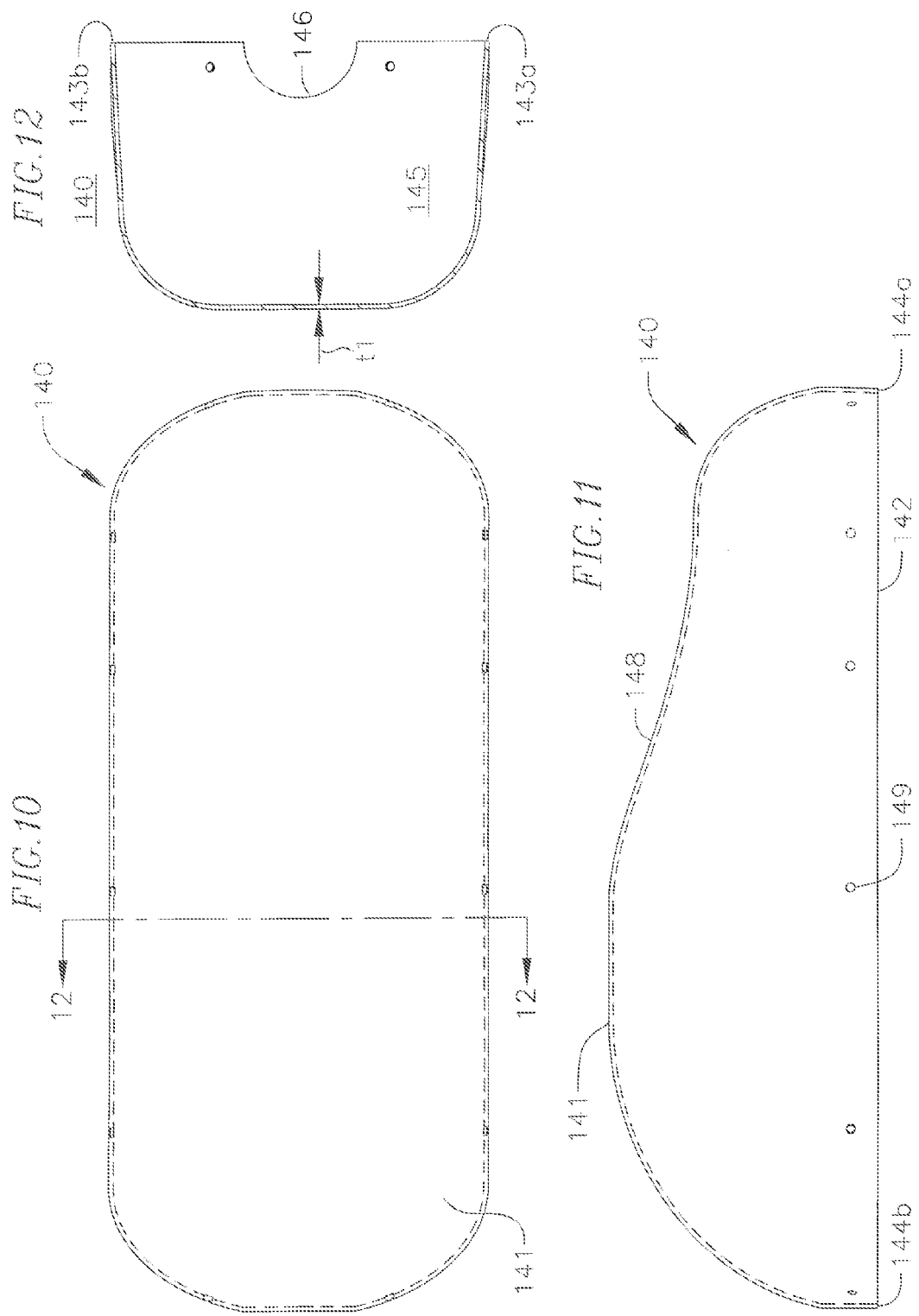

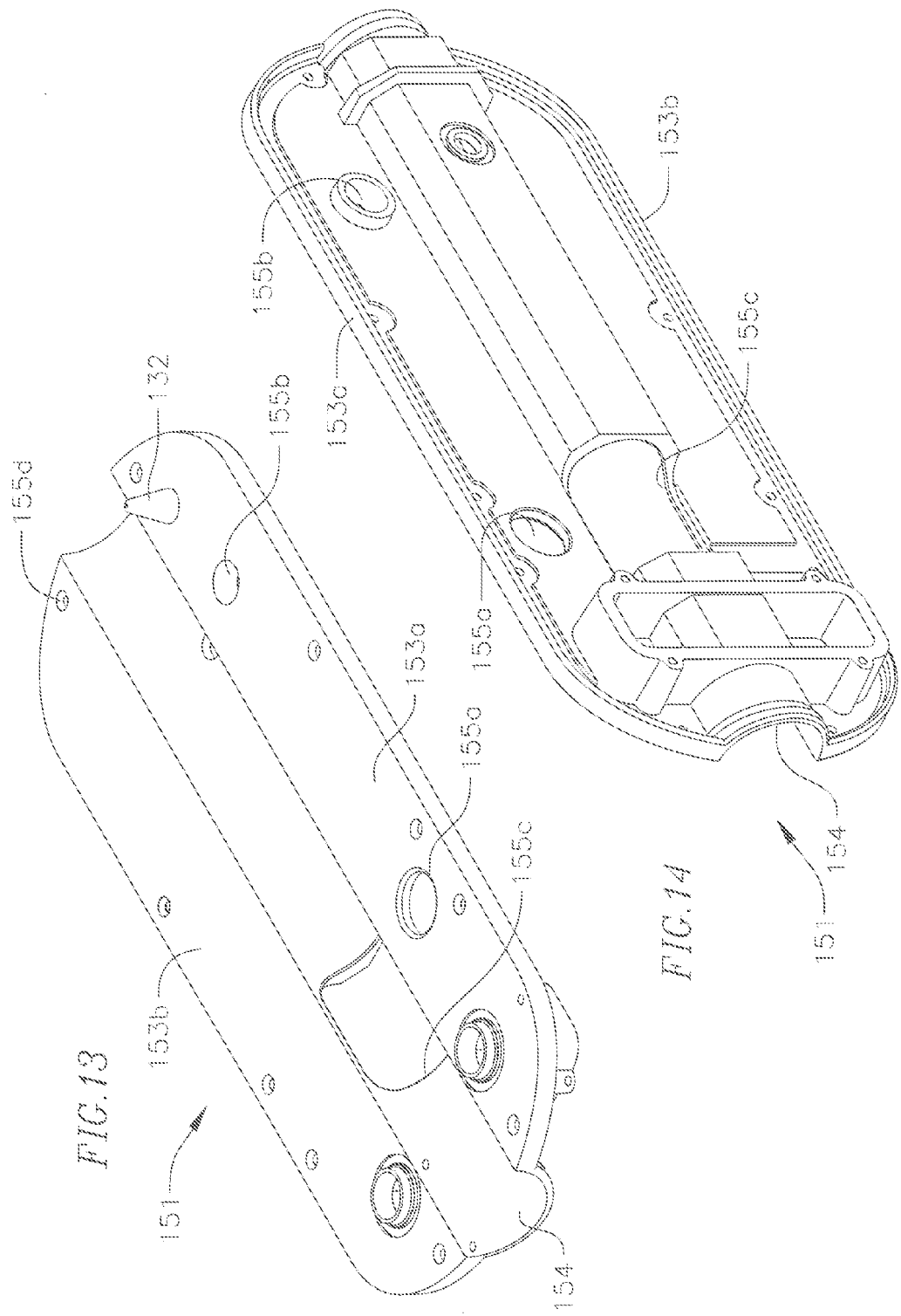

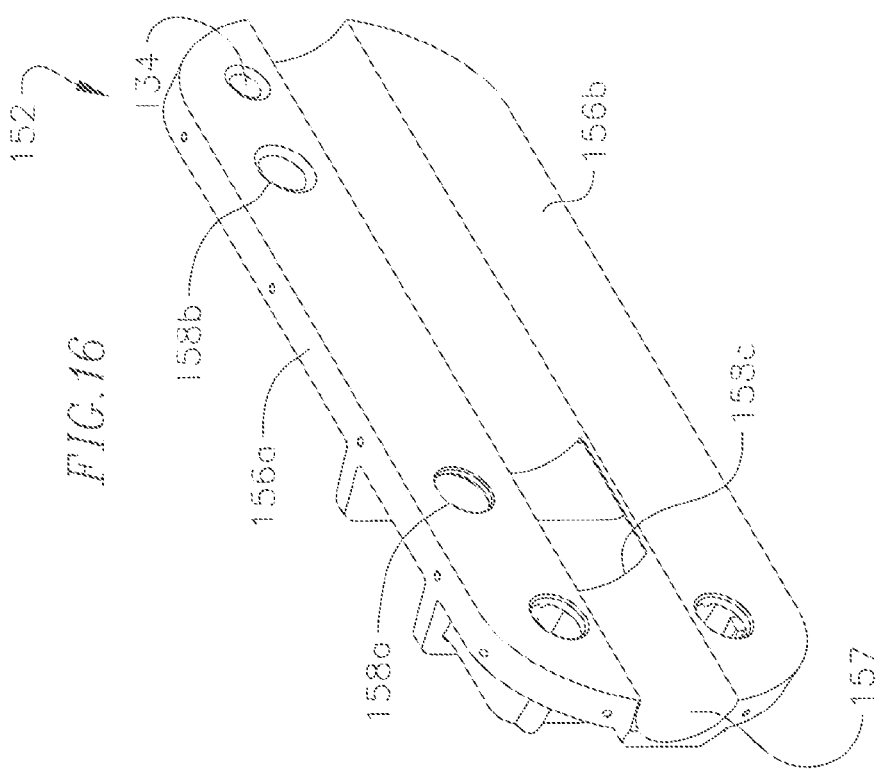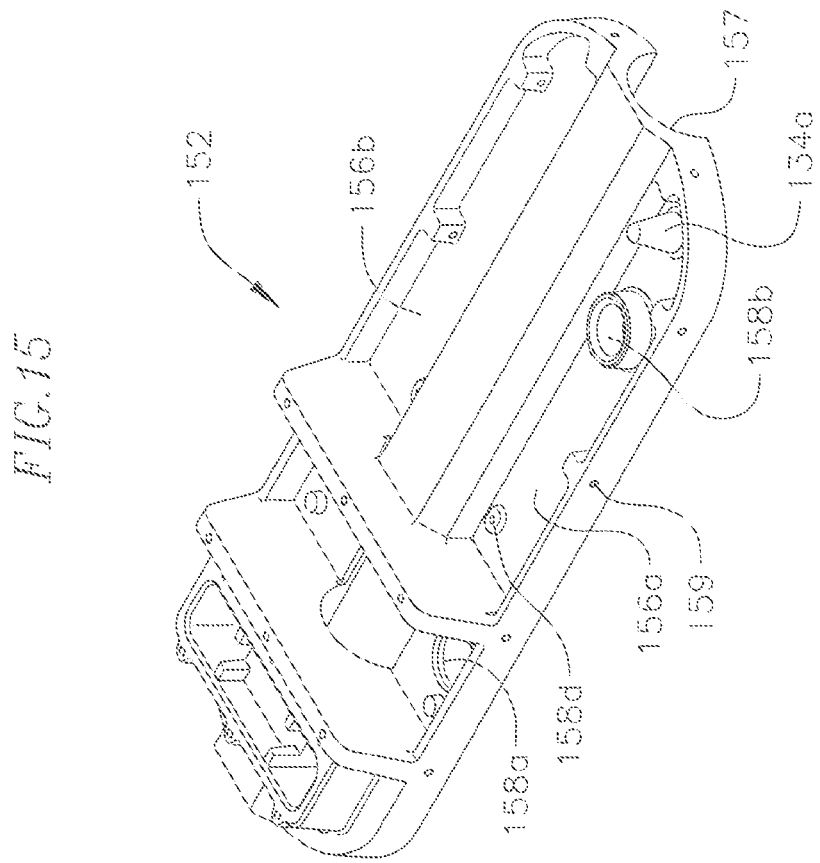

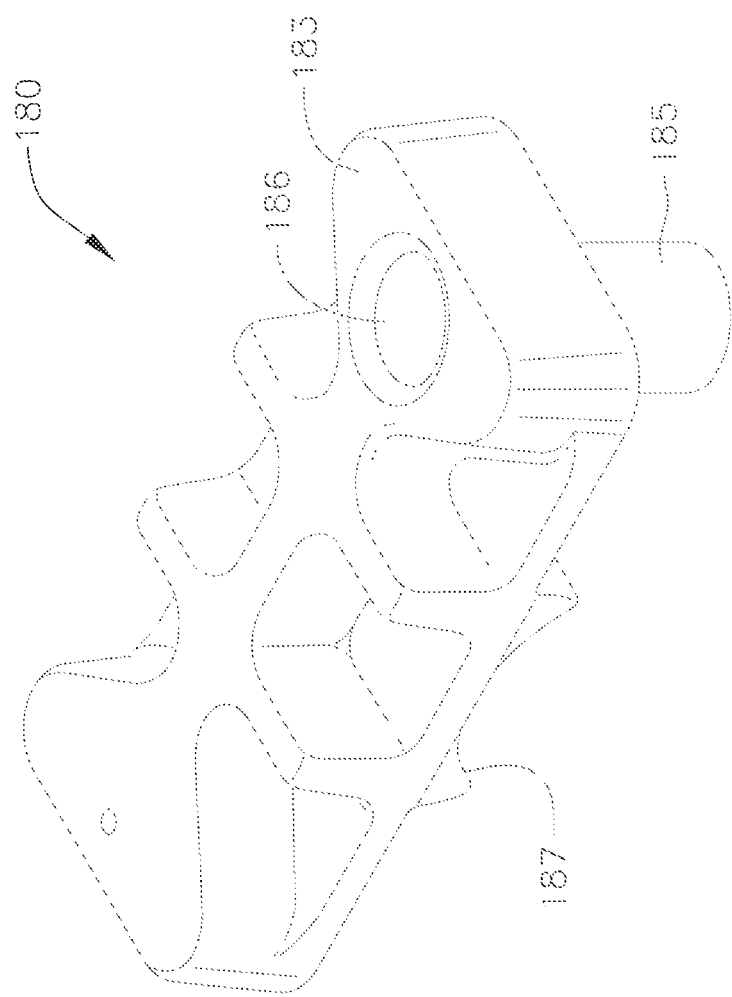

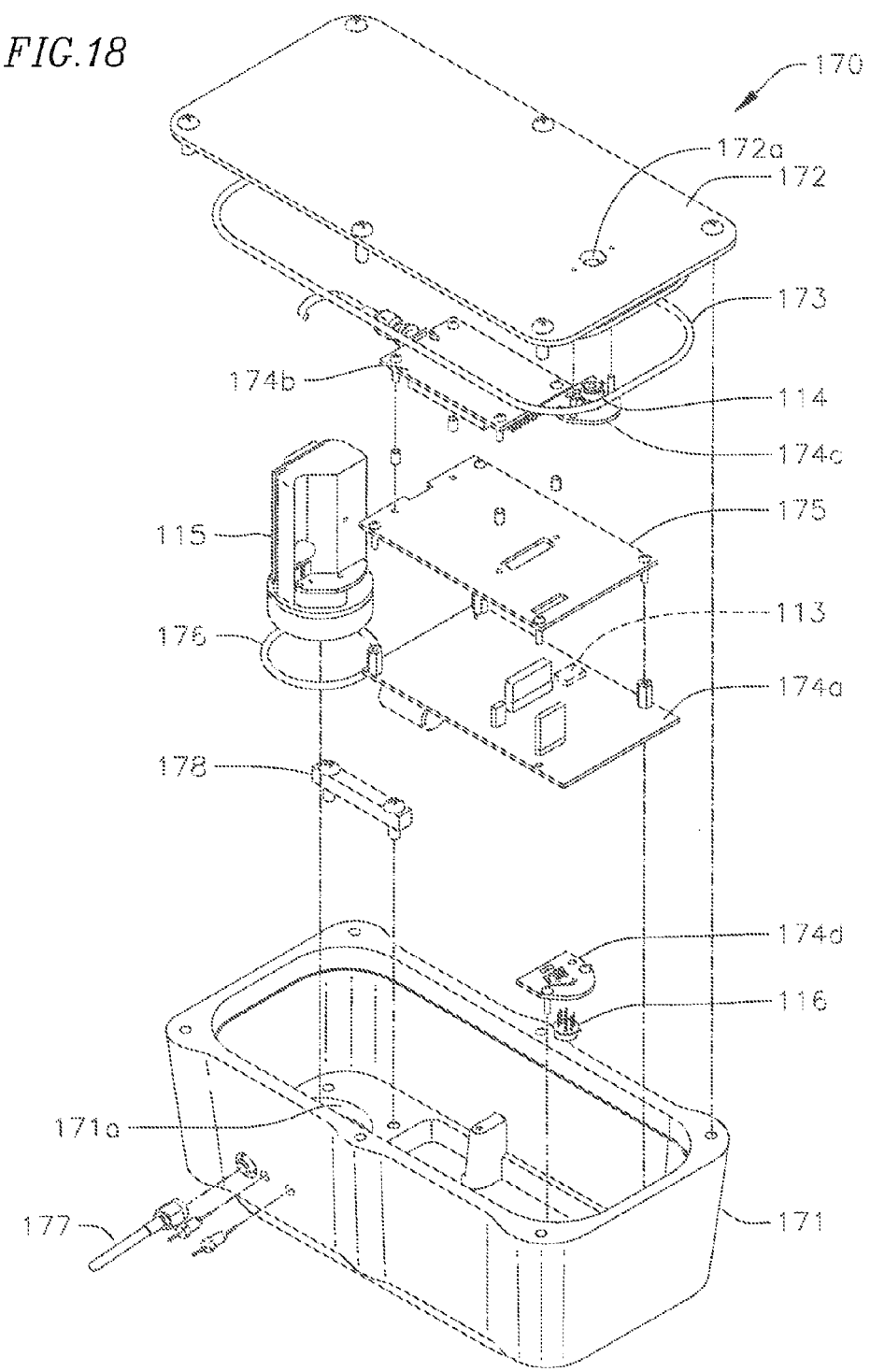

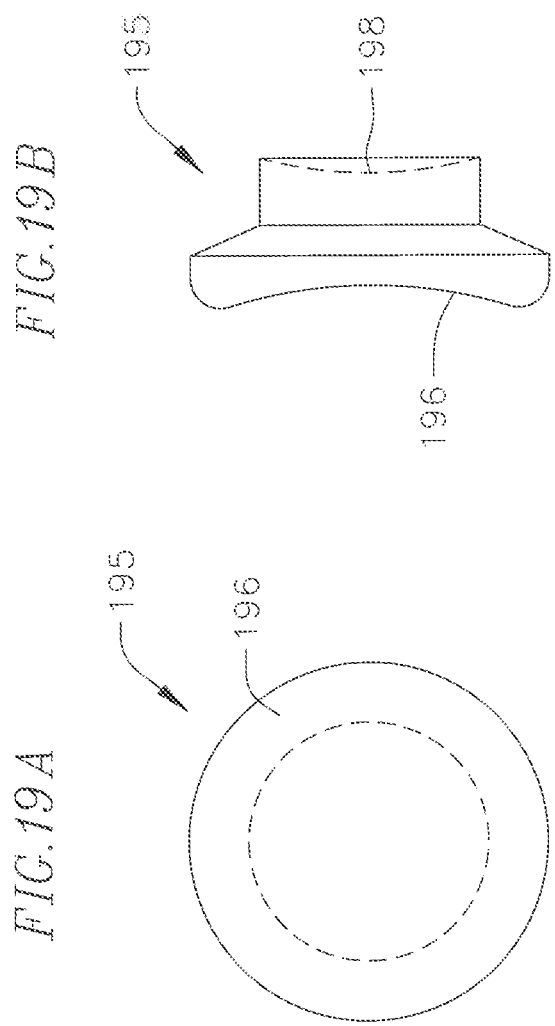

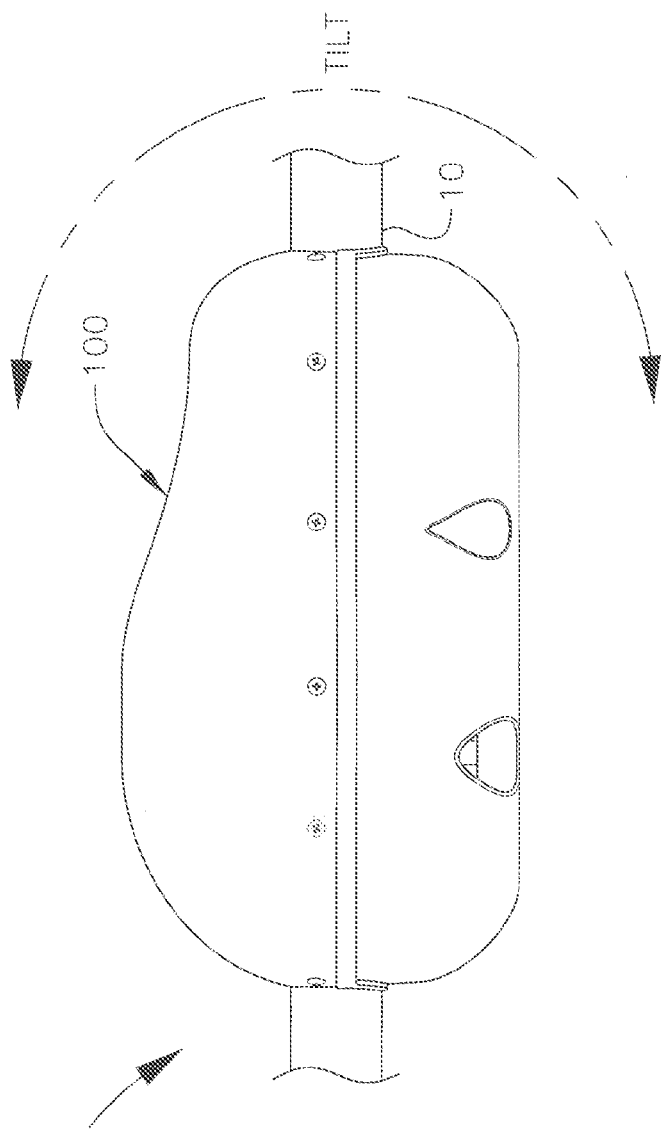
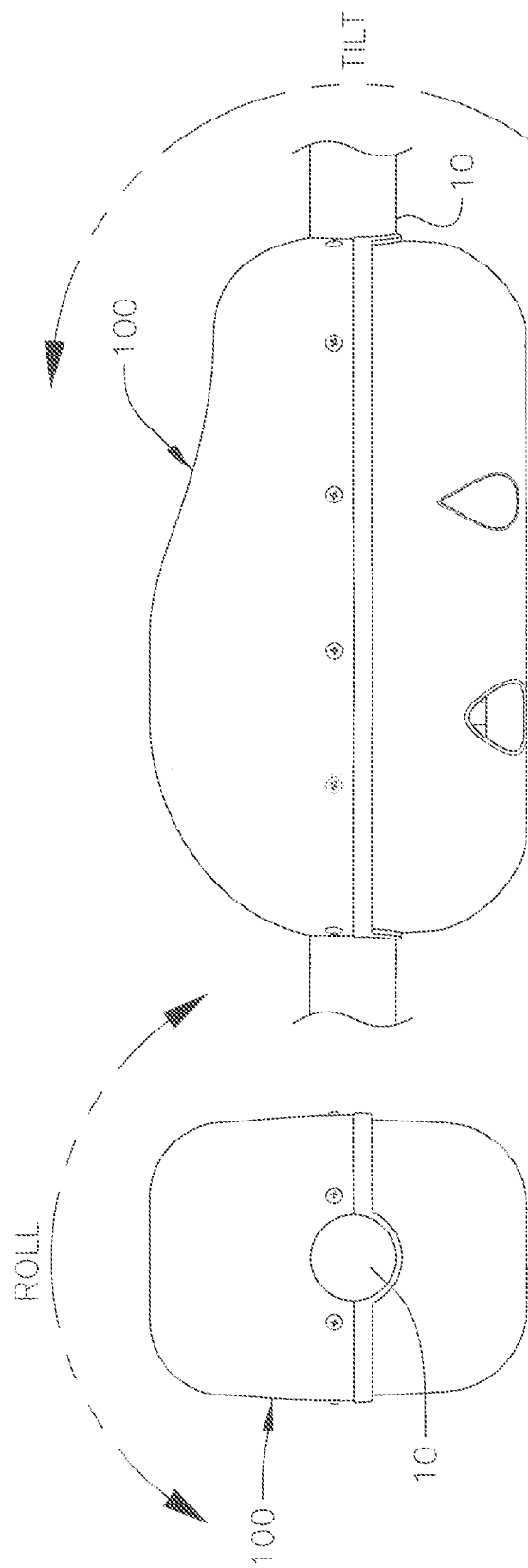
FIG. 21A
FIG. 21B

DYNAMIC REAL TIME TRANSMISSION LINE MONITOR AND METHOD OF MONITORING A TRANSMISSION LINE USING THE SAME

FIELD

Aspects of embodiments of the present invention relate to a dynamic real time transmission line monitor, a dynamic real time transmission line monitoring system, and a method of monitoring a transmission line using the same.

BACKGROUND

Transmission lines are used to supply electric power and may span large distances. Further, a distance between support points of a transmission line may be great, and an amount by which the transmission line may drop down, or sag, between the support points may vary depending on various factors, such as a temperature of the transmission line due to an ambient temperature or an amount of current passing through and heating the transmission line, or environmental factors such as wind or precipitation. When a transmission line drops down by a certain amount, it may contact an object, such as a tree, and result in a disruption in power transmission.

As such, it is desirable that a location of a transmission line in space be known. Further, regulations may require that locations of transmission lines in space be known. Some techniques have been used for predicting or approximating locations of transmission lines in space, such as techniques based on laser scanning using helicopters, and day-ahead forecasting based on an estimated amount of current to be passed through the transmission line, as well as previously collected data for predicted weather parameters. However, such techniques are static, rather than dynamic, and do not yield a real time location of a transmission line in space based on real time measurements.

SUMMARY

According to an aspect of embodiments of the present invention, a dynamic real time transmission line monitor includes a housing configured to receive a transmission line conductor through a cavity thereof, and a sensor to measure or detect a property of the transmission line, such as a temperature, position, current, acceleration/vibration, tilt, roll, and/or distance from an object.

According to another aspect of embodiments of the present invention, a dynamic real time transmission line monitor is configured to send a signal, such as an RF signal, while preventing or reducing a corona discharge. The signal may be sent to another line monitor or to a monitoring station, for example, and may contain real time information related to a property of the transmission line measured or sensed by the transmission line monitor.

According to another aspect of embodiments of the present invention, a dynamic real time transmission line monitor is installable on a transmission line and is self-powered by current of the transmission line.

According to another aspect of embodiments of the present invention, a dynamic real time transmission line monitor is installable on a live transmission line via a hot stick or a bare hand technique.

According to another aspect of embodiments of the present invention, a dynamic real time transmission line monitoring system includes a dynamic real time transmission line monitor having aspects and properties as described above, and which is configured to send real time information related to one or more properties (e.g., temperature, position, current, acceleration, vibration, tilt, roll, and/or distance from an object) of the transmission line to at least one of another transmission line monitor or a monitoring station.

According to another aspect of embodiments of the present invention, a method of dynamic real time transmission line monitoring includes installing a dynamic real time transmission line monitor having aspects and properties as described above on a transmission line, and remotely monitoring real time information related to the transmission line that is transmitted from the monitor.

According to one exemplary embodiment of the present invention, a dynamic real time transmission line monitor includes: a housing installable on a transmission line, the housing including: a base portion; and a cover portion coupled to the base portion and defining a cavity of the housing together with the base portion, at least one of the cover portion or the base portion being movable relative to the other between an open position of the housing in which a length of the transmission line is receivable in the cavity, and a closed position of the housing in which the length of the transmission line is retained in the cavity; a sensor configured to sense in real time at least one of a temperature, a position, a current, an acceleration, a vibration, a tilt, a roll, or a distance to a nearest object; and an antenna in the cavity of the housing, the antenna configured to transmit a signal including information sensed by the sensor away from the monitor in real time.

The cover portion may include a semiconductive material. In one embodiment, a thickness of the cover portion may be less than one tenth of a skin depth of the semiconductive material at which radio waves are blocked. In one embodiment, the semiconductive material has a resistivity of about 10-20 kohm/cm$^2$, and the cover portion has a thickness of about 0.125 inches.

In one embodiment, the dynamic real time transmission line monitor further includes a first alignment portion, and a second alignment portion corresponding to the first alignment portion and configured to engage the first alignment portion for aligning the cover portion on the base portion. The first alignment portion may include a cone-shaped protrusion extending toward the cover portion, and the second alignment portion may include a recess having a shape corresponding to that of the protrusion for receiving the protrusion therein.

In one embodiment, the dynamic real time transmission line monitor is powered by a current of the transmission line.

The sensor may include at least one of a LIDAR sensor, a laser sensor, a temperature sensor, or an accelerometer.

In one embodiment, the sensor includes a temperature sensor, and the dynamic real time transmission line monitor further includes a target portion in contact with the transmission line, the temperature sensor being configured to sense a temperature of the target portion. The target portion may include an aluminum target with a controlled emissivity for accurate temperature measurement, such as black anodized.

In one embodiment, the dynamic real time transmission line monitor further includes a travel bolt, and a keeper portion engaged with the travel bolt and including a biasing mechanism biasing the housing toward the open position, the keeper portion being descendible upon rotation of the travel bolt to move the housing to the closed position, and being further descendible upon further rotation of the travel bolt to retain the transmission line after the housing is in the closed position.

In one embodiment, the dynamic real time transmission line monitor further includes an electronics assembly in the housing and being configured to receive the information from the sensor and cause the antenna to transmit the signal including the information.

According to another exemplary embodiment of the present invention, a dynamic real time transmission line monitoring system includes: a dynamic real time transmission line monitor including a housing installable on a transmission line, a sensor configured to sense in real time at least one of a temperature, a position, a current, an acceleration, a vibration, a tilt, a roll, or a distance to a nearest object, and an antenna in the cavity of the housing, the antenna configured to transmit a signal including information sensed by the sensor away from the monitor in real time; and a remote receiving device receiving the signal from the dynamic real time transmission line monitor.

The remote receiving device may include at least one of a monitoring station or another dynamic real time transmission line monitor.

The remote receiving device may include a computer to accumulate data from the sensor and to calculate real time dynamic transmission line ratings of a critical span of the transmission line using the data accumulated from the sensor, local weather data, and an established algorithm.

The computer may calculate a maximum line rating of the transmission line for a next day using the accumulated data and a weather prediction for the next day.

The system may be configured to take a corrective action based on at least one of the sensed distance to the nearest object or the calculated real time dynamic transmission line ratings.

According to another exemplary embodiment of the present invention, a method of dynamic real time transmission line monitoring includes: providing a dynamic real time transmission line monitor on a transmission line; sensing in real time at least one of a temperature, a position, a current, an acceleration, a vibration, a tilt, a roll, or a distance to a nearest object using a sensor of the dynamic real time transmission line monitor; and transmitting a signal including information sensed using the sensor to a remote receiving device in real time.

The providing the dynamic real time transmission line monitor on the transmission line may include installing the dynamic real time transmission line monitor on the transmission line while the transmission line is live. The installing the dynamic real time transmission line monitor on the transmission line may further include installing the dynamic real time transmission line monitor on the transmission line using a hot stick or bare hand.

In one embodiment, the dynamic real time transmission line monitor includes a housing including a base portion and a cover portion coupled to the base portion and defining a cavity of the housing together with the base portion, and at least one of the cover portion or the base portion is movable relative to the other between an open position of the housing in which the cover portion and the base portion are spaced apart, and a closed position of the housing, and the installing the dynamic real time transmission line monitor on the transmission line includes: inserting a length of the transmission line between the cover portion and the base portion into the cavity while the housing is in the open position; and moving the at least one of the cover portion or the base portion relative to the other to the closed position to retain the length of the transmission line in the cavity.

The sensor may include at least one of a LIDAR sensor, a laser sensor, a temperature sensor, or an accelerometer.

The remote receiving device may include at least one of a monitoring station or another dynamic real time transmission line monitor.

In one embodiment, the providing the dynamic real time transmission line monitor on the transmission line includes providing the dynamic real time transmission line monitor on a critical span of the transmission line, and the method further includes calculating real time dynamic is transmission line ratings using local weather data and an established algorithm.

The method may further include calculating a maximum line rating of the transmission line for a next day using data measured by the dynamic real time transmission line monitor and a weather prediction for the next day.

The method may further include taking a corrective action based on at least one of the sensed distance to the nearest object or the calculated real time dynamic transmission line ratings.

BRIEF DESCRIPTION OF THE DRAWINGS

The above and other features, aspects, and advantages of the present invention will become better understood with regard to the following description, appended claims, and accompanying drawings where:

FIG. 2 is a bottom view of the transmission line monitor of FIG. 1;

FIG. 3 is a side sectional view of the transmission line monitor of FIG. 1, taken at the line 3-3;

FIG. 4 is a bottom perspective view of the transmission line monitor of FIG. 1, shown installed on a transmission line;

FIG. 5 is a side view of the transmission line monitor of FIG. 1, shown in an open position;

FIG. 6 is a front view of the transmission line monitor of FIG. 1, shown in an open position;

FIG. 7 is an exploded top perspective view of the transmission line monitor of FIG. 1;

FIG. 8 is a top perspective view of a base portion of a housing of the transmission line monitor of FIG. 1;

FIG. 9 is a bottom perspective view of the base portion of FIG. 8;

FIG. 10 is a top view of a cover portion of a housing of the transmission line monitor of FIG. 1;

FIG. 11 is a side perspective view of the cover portion of the housing of FIG. 10;

FIG. 12 is a front sectional view of the cover portion of FIG. 10, taken at the line 12-12;

FIG. 13 is a top perspective view of a lower non-conductive portion of a housing of the transmission line monitor of FIG. 1;

FIG. 14 is a bottom perspective view of the lower non-conductive portion of FIG. 13;

FIG. 15 is a top perspective view of an upper non-conductive portion of a housing of the transmission line monitor of FIG. 1;

FIG. 16 is a bottom perspective view of the upper non-conductive portion of FIG. 15;

FIG. 17 is a top perspective view of a keeper of the transmission line monitor of FIG. 1;

FIG. 18 is an exploded top perspective view of an electronics assembly of the transmission line monitor of FIG. 1;

FIGS. 19A and 19B are top and side views, respectively, of a temperature sensing target of the transmission line monitor of FIG. 1;

FIGS. 21A and 21B are schematic views respectively illustrating roll and tilt of a dynamic real time transmission line monitor installed on a transmission line, according to an embodiment of the present invention;

DETAILED DESCRIPTION

Figure 1:
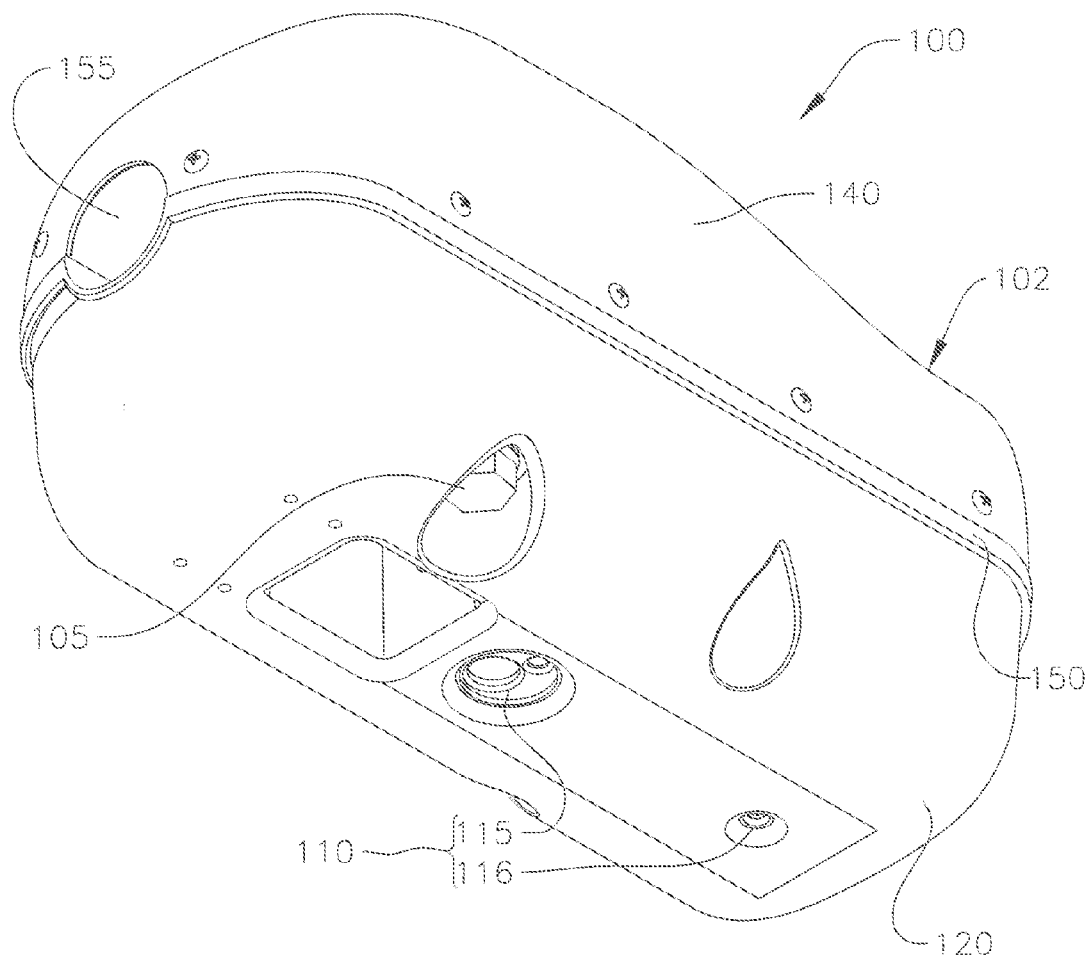
FIG. 1 is a bottom perspective view of a dynamic real time transmission line monitor according to an embodiment of the present invention.

In the following detailed description, certain exemplary embodiments of the present invention are shown and described, by way of illustration. As those skilled in the art would recognize, the described exemplary embodiments may be modified in various ways without departing from the spirit and scope of the present invention. Accordingly, the drawings and description are to be regarded as illustrative in nature, rather than restrictive.

With reference to FIGS. 1 to 4, a dynamic real time transmission line monitor 100 according to an embodiment of the present invention includes a housing 102 having an interior cavity 104. The transmission line monitor 100 is installable on a transmission line 10 (see, e.g., FIG. 4) and further includes one or more sensors 110 configured to sense in real time at least one of a temperature, a position, a current, an acceleration/vibration, a tilt, a roll, or a distance of the transmission line 10 from an object, and an antenna 112 configured to transmit a signal including information sensed by the sensor 110 away from the transmission line monitor 100 in real time.

The one or more sensors 110 are configured to sense in real time at least one of a temperature, a position, a current, an acceleration, a tilt, a roll, or a distance of the transmission line 10 from an object 15. The one or more sensors 110, in one embodiment, include an accelerometer 113 for measuring a vibration frequency spectrum or a tilt and roll of the transmission line 10. In one embodiment, the accelerometer 113 is a microelectromechanical system (MEMS) accelerometer. The one or more sensors 110, in one embodiment, include a temperature sensor 114 configured to measure a temperature of the transmission line 10. In one embodiment, the temperature sensor 114 measures the temperature at a location of the transmission line 10 that is in the cavity 104 of the housing 102. The temperature sensor 114 may be a thermocouple or an infrared temperature measuring device. In one embodiment, the one or more sensors 110 include a distance sensor 115 configured to measure a distance to an object 15, such as a nearest object. In one embodiment, the distance sensor 115 is a LIDAR sensor that measures a distance to the object 15 (e.g., a nearest object). The one or more sensors 110, in one embodiment, include an ambient temperature sensor 116 configured to measure an ambient temperature outside the housing 102. The ambient temperature sensor 116 may be an infrared temperature measuring device. In one embodiment, the transmission line monitor 100 includes each of the temperature sensor 114, the distance sensor 115, the accelerometer 113, and the ambient temperature sensor 116. However, in other embodiments, one or more of the above-described sensors may not be present in the transmission line monitor 100. Further, the present invention is not limited to the above-described sensors, and, in other embodiments, the transmission line monitor 100 may include any other suitable sensors or devices configured to sense, measure, or detect a property of the transmission line 10 or environment.

The antenna 112 is configured to transmit a signal including information sensed by the one or more sensors 110 away from the transmission line monitor 100 in real time. The antenna 112, in one embodiment, transmits a radio wave signal away from the transmission line monitor 100 in real time, and may include a board made of FR4 composite or a dipole antenna or another suitable antenna. However, the present invention is not limited thereto, and, in other embodiments, the antenna 112 may be any other suitable device for transmitting a signal including information sensed by the one or more sensors 110 away from the transmission line monitor 100 in real time.

The housing 102 includes a base portion 120 and a cover portion 140. The cover portion 140 is coupled to the base portion 120 and defines the cavity 104 of the housing 102 together with the base portion 120. Further, at least one of the cover portion 140 or the base portion 120 is movable relative to the other between an open position (see FIGS. 5 and 6) of the housing 102 in which a length of the transmission line 10 is receivable into or removable from the cavity 104 of the housing 102 through a gap 108 between the base portion 120 and the cover portion 140, and a closed position (see FIG. 1) of the housing 102 in which the length of the transmission line 10 is retained in the cavity 104.

In one embodiment, the transmission line monitor 100 includes a travel bolt 105 engaged between the base portion 120 and the cover portion 140 for moving the housing 102 between the open and closed positions. Further, in one embodiment, the transmission line monitor 100 includes a keeper 106 coupled to the travel bolt 105 and which continues to descend to retain the transmission line 10 in the cavity 104 after the housing 102 is in the closed position such that the housing 102 may be moved to the closed position and the transmission line monitor 100 may be fixed in place on the transmission line 10 by rotation of only the single travel bolt 105. The travel bolt 105 and the keeper 106 allow the transmission line monitor 100 to be easily installed on the transmission line 10 while the transmission line 10 is live using a hot stick or bare hand technique. In one embodiment, the travel bolt has a large size, such as ⅝-inch, to facilitate installation of the transmission line monitor 100 while the transmission line 10 is live using a hot stick or bare hand technique.

In one embodiment, the transmission line monitor 100 further includes a first alignment portion 132, and a second alignment portion 134 corresponding to the first alignment portion 132 and configured to engage the first alignment portion 132 for aligning the cover portion 140 on the base portion 120. In one embodiment, the first alignment portion 132 is a cone-shaped protrusion extending toward the cover portion 140, and the second alignment portion 134 is a recess having a shape corresponding to that of the protrusion for receiving the protrusion therein. However, the present invention is not limited thereto, and, in other embodiments, the first and second alignment portions 132 and 134 may have any other suitable configuration for aligning the cover portion 140 on the base portion 120. Further, in one embodiment, the transmission line monitor 100 includes an anti-rotation post 135 configured to maintain an angular alignment of the cover portion 140 relative to base portion 120. The anti-rotation post 135, in one embodiment, is made of polyvinyl chloride (PVC) pipe (e.g., ½-inch PVC pipe). However, the present invention is not limited thereto, and, in other embodiments, the anti-rotation post 135 may be made of any other suitable material.

With reference to FIGS. 8 and 9, the base portion 120 includes a substantially closed bottom side 121 and an open upper side 122. In one embodiment, the base portion 120 has an oblong shape with substantially straight front and rear sides 123a, 123b, and rounded first and second ends 124a, 124b. The base portion 120 may also be rounded between the bottom side 121 and the upper side 122 along the front and rear sides 123a, 123b and the first and second ends 124a, 124b. However, the present invention is not limited to the above-described shape of the base portion 120, and, in other embodiments, the base portion 120 may have any other suitable shape. An inner cavity 125 of the base portion 120 is defined between the front and rear sides 123a, 123b and the first and second ends 124a, 124h. First and second openings 126a, 126b are formed at the first and second ends 124a, 124b, respectively, and receive a portion of the transmission line 10 therein. In one embodiment, the first and second openings 126a, 126b each have a substantially semi-circular shape having a radius corresponding to that of the largest transmission line 10. The base portion 120 includes a cradle portion 127 between the first and second openings 126a, 126b which receives the transmission line 10 and has a substantially semi-circular shape having a radius corresponding to that of the largest transmission line 10. In one embodiment, the cradle portion 127 may have a grooved receiving surface, as depicted in FIG. 8. The base portion 120 includes an opening 128a through the bottom side 121 receiving the travel bolt 105 therethrough, and may further include a recess 128b surrounding the opening 128a at an outer side of the bottom side 121, such as for receiving a head of the travel bolt 105. In one embodiment, the base portion 120 may include a plurality of fastener holes 129 around a periphery of a surface at the upper side 122. Further, the base portion 120 may include openings 129a and 129b through the bottom side 121 through which the distance sensor 115 and the ambient temperature sensor 116 are exposed. The base portion 120, in one embodiment, is made of aluminum, such as by casting or machining. However, the present invention is not limited thereto, and, in other embodiments, the base portion 120 may be made of any other suitable material.

With reference to FIGS. 10 to 12, the cover portion 140 includes a substantially closed top side 141 and an open lower side 142. The open lower side 142, in one embodiment, has a perimeter shape substantially corresponding to a perimeter shape of the open upper side 122 of the base portion 120. That is, in one embodiment, the cover portion 140 has an oblong shape with substantially straight front and rear sides 143a, 143b, and rounded first and second ends 144a, 144b. The cover portion 140 may also be rounded between the top side 141 and the lower side 142 along the front and rear sides 143a, 143h and the first and second ends 144a, 144b. However, the present invention is not limited to the above-described shape of the cover portion 140, and, in other embodiments, the cover portion 140 may have any other suitable shape. An inner cavity 145 of the cover portion 140 is defined between the front and rear sides 143a, 143b and the first and second ends 144a, 144b. The inner cavity 145 of the cover portion 140 and the inner cavity 125 of the base portion 120 together make up the cavity 104 of the housing 102. Openings 146 are formed at the first and second ends 144a, 144b, respectively, and receive a portion of the transmission line 10 therein. In one embodiment, the openings 146 each have a substantially semi-circular shape having a radius corresponding to that of the largest transmission line 10. The top side 141 includes a sloped or tapered portion 148 extending upward in a direction from the first end 144a toward the second end 144b to a highest part of the top side 141 to provide a space in the cavity 145 accommodating the antenna 112. In one embodiment, the sloped or tapered portion 148 has a gentle slope or taper having a 1-inch diameter curvature or greater. In one embodiment, the cover portion 140 may include a plurality of fastener holes 149 around a periphery of the lower side 142.

The cover portion 140 is made of a semiconductive material, such that radio waves from the antenna 112 may penetrate through the cover portion 140 while a corona discharge is prevented or substantially prevented by the cover portion 140. In one embodiment, the transmission line monitor 100 is free of corona discharge at 500 kV. In one embodiment, the cover portion 140 is made of ABS/PVC thermoplastic. In one embodiment, a thickness ti (see FIG. 12) of the cover portion 140 may be less than one tenth of a skin depth of the semiconductive material at which radio waves are completely blocked, where the skin depth is a function of a resistivity of the semiconductive material. In one embodiment, the cover portion 140 is made of ABS/PVC thermoplastic having a thickness of about 0.125 inches. The semiconductive material may have a resistivity of about 10-20 kohm/cm$^2$.

The transmission line monitor 100, in one embodiment, further includes a non-conductive inner portion 150 between the base portion 120 and the cover portion 140 of the housing 102. The non-conductive inner portion 150 includes a tubular portion or channel 155 (see FIG. 1) receiving a length of the transmission line 10 that is in the cavity 104 of the housing 102. The non-conductive inner portion 150, in one embodiment, includes a lower non-conductive inner portion 151 in the cavity 125 of the base portion 120, and an upper non-conductive inner portion 152 in the cavity 145 of the cover portion 140.

With reference to FIGS. 13 and 14, the lower non-conductive inner portion 151, in one embodiment, includes a front lateral portion 153a, a rear lateral portion 153b, and a lower channel portion 154. The lower non-conductive inner portion 151, in one embodiment, has a perimeter shape substantially corresponding to a perimeter shape of the open upper side 122 of the base portion 120. That is, in one embodiment, the lower non-conductive inner portion 151 has an oblong shape with substantially straight front and rear sides, and rounded first and second ends. However, the present invention is not limited to the above-described shape of the lower non-conductive inner portion 151, and, in other embodiments, the lower non-conductive inner portion 151 may have any other suitable shape. The lower channel portion 154 extends along a length of the lower non-conductive inner portion 151 and has a substantially semi-circular shape having a radius corresponding to that of the largest transmission line 10. The first alignment portion 132, in one embodiment, is on an upper surface of the front lateral portion 153a and is a cone-shaped protrusion extending toward the upper non-conductive inner portion 152. The front lateral portion 153*a* has an opening 155*a* through which the travel bolt 105 passes at a location corresponding to the opening 128*a* of the base portion 120. The front lateral portion 153*a* may also have an opening 155*b*, such as a threaded opening, in which the anti-rotation post 135 is received (e.g., threadedly engaged). Further, an opening 155*c* is formed through the lower channel portion 154 at a location corresponding to the cradle portion 127 of the base portion 120. In one embodiment, the lower non-conductive inner portion 151 may include a plurality of fastener holes 155*d* around a periphery of the front and rear lateral portions 153*a* and 153*b*, and the lower non-conductive inner portion 151 may be fastened to the base portion 120 via fasteners through the fastener holes 155*d* and the fastener holes 129 of the base portion 120.

With reference to FIGS. 15 and 16, the upper non-conductive inner portion 152, in one embodiment, includes a front lateral portion 156*a*, a rear lateral portion 156*b*, and an upper channel portion 157. The upper non-conductive inner portion 152, in one embodiment, has a perimeter shape substantially corresponding to a perimeter shape of the open lower side 142 of the cover portion 140. That is, in one embodiment, the upper non-conductive inner portion 152 has an oblong shape with substantially straight front and rear sides, and rounded first and second ends. However, the present invention is not limited to the above-described shape of the upper non-conductive inner portion 152, and, in other embodiments, the upper non-conductive inner portion 152 may have any other suitable shape. The upper channel portion 157 extends along a length of the upper non-conductive inner portion 152 and has a substantially semi-circular shape having a radius corresponding to that of the largest transmission line 10. The upper channel portion 157 of the upper non-conductive inner portion 152 and the lower channel portion 154 of the lower non-conductive inner portion 151 together make up the channel 155 of the non-conductive inner portion 150. The second alignment portion 134, in one embodiment, is at a lower surface of the front lateral portion 156*a* and is a recess having a shape substantially corresponding to the cone-shaped protrusion of the first alignment portion 132 for receiving the first alignment portion 132 therein to align the cover portion 140 on the base portion 120. The recess of the second alignment portion 134 faces the lower non-conductive inner portion 151 and may be formed inside a hollow cone-shaped protrusion 134*a* protruding from an upper side of the front lateral portion 156*a*. The front lateral portion 156*a* has an opening 158*a* through which the travel bolt 105 passes at a location corresponding to the opening 155*a* of the lower non-conductive inner portion 151. The front lateral portion 156*a* also has an opening 158*b* in which the anti-rotation post 135 is received. Further, an anti-rotation post stop 136 (see FIG. 7) is received in the opening 158*b*. The opening 158*b* may be surrounded by a flanged portion extending from the upper side of the front lateral portion 156*a*, as depicted in FIG. 15. Further, an opening 158*c* is formed through the upper channel portion 157 at a location corresponding to a cradle portion 187 of the keeper 106, described later herein. The upper non-conductive inner portion 152 may further include fastener holes 158*d* for fastening the antenna 112 to the upper non-conductive inner portion 152, such as via antenna mounting brackets 118 (see FIG. 7). In one embodiment, the upper non-conductive inner portion 152 may include a plurality of fastener holes 159 around a periphery of the front and rear lateral portions 156*a* and 156*b*, and the upper non-conductive inner portion 152 may be fastened to the cover portion 140 via fasteners through the fastener holes 159 and the fastener holes 149 of the cover portion 140.

The non-conductive inner portion 150, in one embodiment, is made of fiberglass, such as by casting. In one embodiment, for example, the non-conductive inner portion 150 is made of a vinyl ester resin with ⅓₂-inch milled fibers. However, the present invention is not limited thereto, and, in other embodiments, the non-conductive inner portion 150 may be made of a cast high-temperature polymer, glass-filled nylon, or any other suitable material.

With reference to FIGS. 7 and 17, the keeper 106, in one embodiment, includes a keeper plate 180 and one or more biasing members 182, such as compression springs. The keeper 106 is engaged with the travel bolt 105 and descends via rotation of the travel bolt 105 to move the housing 102 to the closed position and continues to descend upon further rotation of the travel bolt 105 to retain the transmission line 10 after the housing 102 is in the closed position. As such, the housing 102 may be moved to the closed position and the transmission line monitor 100 may be efficiently and easily fixed at a location on the transmission line 10 by rotation of only the single travel bolt 105. The keeper plate 180, in one embodiment, includes a body portion 183 and a tubular portion 185 protruding downward from the body portion 183. The tubular portion 185 has an opening 186 in which the travel bolt 105 is received. The keeper plate 180 further includes a cradle portion 187 which retains the transmission line 10 opposite the cradle portion 127 of the base portion 120. The keeper plate 180, in one embodiment, is made of aluminum, such as by casting or machining. However, the present invention is not limited thereto, and, in other embodiments, the keeper plate 180 may be made of any other suitable material.

The keeper 106 further includes a threaded member 190 threadedly engaged with the travel bolt 105 in a threaded opening 105*a* at an upper end thereof. The keeper 106 further includes a keeper cover 188 that is fixed to an upper side of the upper non-conductive inner portion 152, and which provides an upper stop for the keeper plate 180. The one or more biasing members 182 bias the keeper plate 180 against the keeper cover 188. In one embodiment, the opening 186 may have a recess (e.g., a bore) at an upper portion of the opening 186 receiving a head of the threaded member 190. Similarly, the opening 186 may have a recess (e.g., a bore), at a lower portion of the opening 186 and receiving the upper end of the travel bolt 105. When the travel bolt 105 is rotated relative to the threaded member 190, the keeper plate 180 is moved downward, and the cover portion 140 is moved downward together with the keeper plate 180 due to the one or more biasing members 182 biasing the keeper plate 180 against the keeper cover 188. In this manner, the travel bolt 105 may be rotated until the housing 102 is in the closed position. After the housing 102 is in the closed position, the travel bolt 105 may be further rotated against a biasing force of the one or more biasing members 182, such as compressing the compression springs, to move the keeper plate 180 further downward and retain the cradle portion 187 against the transmission line 10. The one or more biasing members 182 bias the housing 102 toward the open position, and when the travel bolt 105 is rotated in an opposite direction, the one or more biasing members 182 force the keeper plate 180 upward.

With reference to FIG. 18, the electronics assembly 170, in one embodiment, includes an electronics housing 171 and one or more circuit assemblies making up a computer of the transmission line monitor 100 that is configured to receive and manipulate information sensed by the one or more sensors 110, and cause the signal containing the information to be transmitted from the antenna 112. In one embodiment, the electronics housing 171 houses the one or more circuit assemblies and is sealed with a cover 172 and a gasket 173. In one embodiment, the one or more circuit assemblies include a first circuit assembly 174a, a second circuit assembly 174b, a third circuit assembly 174c, and a fourth circuit assembly 174d. In one embodiment, the first circuit assembly 174a is a main circuit assembly of the electronics assembly 170 and may make up the computer. The second circuit assembly 174b may be a daughter board assembly for the antenna 112 and may be mounted in the electronics housing 171 via a mounting bracket 175. The third and fourth circuit assembly 174c and 174d may be temperature sensor circuit assemblies corresponding to the temperature sensor 114 and the ambient temperature sensor 116, respectively. The electronics housing 171, in one embodiment, houses the distance sensor 115 and has an opening 171a formed through a bottom side of the electronics housing 171 through which the distance sensor 115 is exposed. The electronics assembly 170 may include a distance sensor mounting bracket 178 mounting the distance sensor 115 in the electronics housing 171, and a gasket 176, such as an O-ring, weatherproofing the opening 171a. The electronics housing 171 may also house the ambient temperature sensor 116 and have an opening 171b (see FIG. 3) formed through the bottom side of the electronics housing 171 through which the ambient temperature sensor 116 is exposed. Further, the electronics housing 171 may house the temperature sensor 114, and the cover 172 may have an opening 172a through which the temperature sensor 114 is exposed. In one embodiment, the electronics assembly 170 includes a cable 177 passing outside the electronics housing 171 to the antenna 112 to communicate therewith. The electronics housing 171 and the cover 172, in one embodiment, are made of aluminum, such as by casting or machining. However, the present invention is not limited thereto, and, in other embodiments, the electronics housing 171 and the cover 172 may be made of any other suitable material.

The transmission line monitor 100, in one embodiment, further includes a current transformer 192 for powering the transmission line monitor 100, such as the electronics assembly 170, or computer, and the one or more sensors 110 using a current of the transmission line 10. As such, the transmission line monitor 100 may be self-powered via the current of the transmission line 10. The current transformer 192 may be housed in a current transformer housing 194. Further, in one embodiment, a current of the transmission line 10 may be measured using the current transformer. In one embodiment, the transmission line monitor 100 includes an electronic switch and a position resistor.

The transmission line monitor 100, in one embodiment, includes a temperature sensing target 195, a temperature of which is measured by the temperature sensor 114. The temperature sensing target 195 is in contact with the transmission line 10 such that a temperature of the temperature sensing target 195 is the same or substantially the same as a temperature of the transmission line 10. The temperature sensing target 195, in one embodiment, is configured as shown in FIGS. 19A and 19B. That is, in one embodiment, the temperature sensing target 195 includes a concave contact surface 196 having a radius of curvature corresponding to a radius of the transmission line 10, and a target surface 198 opposite the contact surface 196. For example, in one embodiment, where the transmission line monitor 100 is configured to be installed on a transmission line conductor having a diameter of two inches, the contact surface has a radius of one inch. In one embodiment, the temperature sensing target 195 is made of aluminum and is anodized black on at least the target surface 198 at which the temperature sensor 114 measures the temperature. The target surface 198 has an emissivity of one or approximately one due to the black anodizing to facilitate an accurate temperature measurement, compared to measuring the temperature directly of a surface of the transmission line 10.

Figure 20:
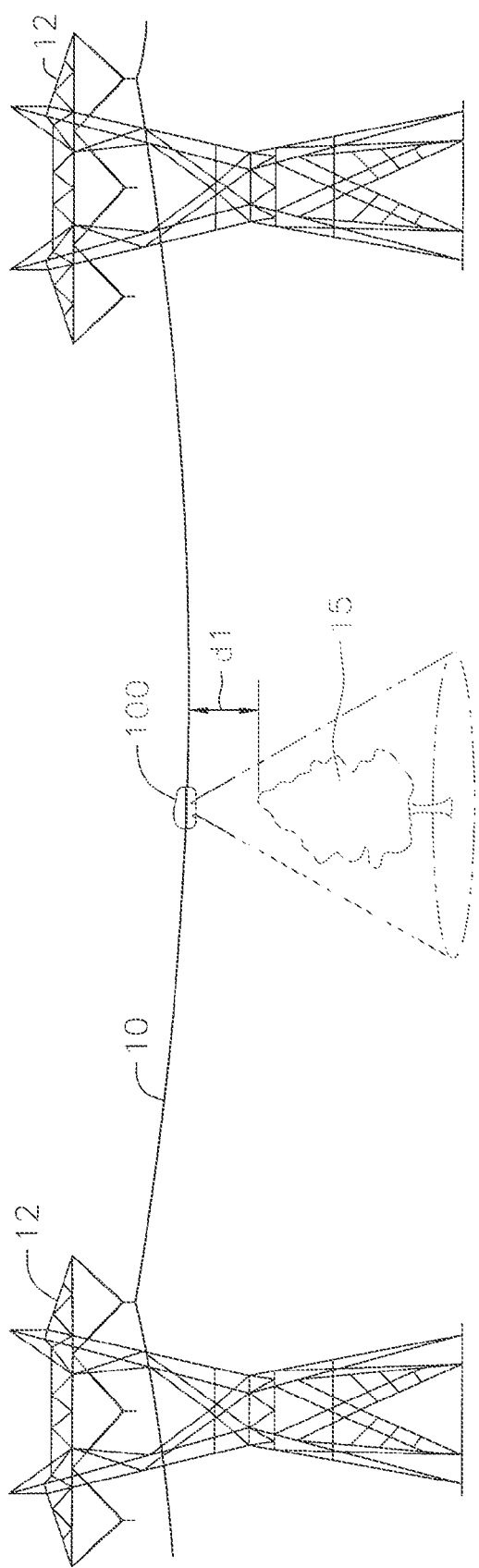
FIG. 20 is a schematic view of a dynamic real time transmission line monitor installed on a transmission line, according to an embodiment of the present invention.

With reference to FIG. 20, the dynamic real time transmission line monitor 100 is shown installed on the transmission line 10, according to an embodiment of the present invention. In one embodiment, the transmission line monitor 100 may be installed at a location along the transmission line 10 that is supported by a pair of towers 12. For example, the transmission line monitor 100 may be installed on the transmission line 10 at a location that is equidistant or substantially equidistant from the towers 12, as depicted in FIG. 20. A nearest object 15 (e.g., a tree or the ground) below the transmission line 10 is detected, and a distance d1 to the object 15 is measured by the transmission line monitor 100. According to an embodiment of the present invention, the transmission line monitor 100 is small and lightweight, such as about 16.5 inches long and less than 25 pounds, further facilitating easy installation of the transmission line monitor 100 on the transmission line 10.

With reference to FIGS. 21A and 21B, a roll and a tilt of the dynamic real time transmission line monitor 100 installed on the transmission line are illustrated, according to an embodiment of the present invention. The transmission line monitor 100, in one embodiment, detects and/or measures an amount of the roll (see FIG. 21A) via the accelerometer 113 (e.g., a MEMS accelerometer) described above. Further, the transmission line monitor 100, in one embodiment, detects and/or measures an amount of the tilt (see FIG. 21B) via the accelerometer 113. Because the transmission line monitor 100 is installed on the transmission line 10 at a location thereof, a roll and tilt of the transmission line 10 at the location where the transmission line monitor 100 is installed may be derived from the measured roll and tilt of the transmission line monitor 100. Roll and tilt of the transmission line 10 may be caused by wind or precipitation, for example.

Figure 22:
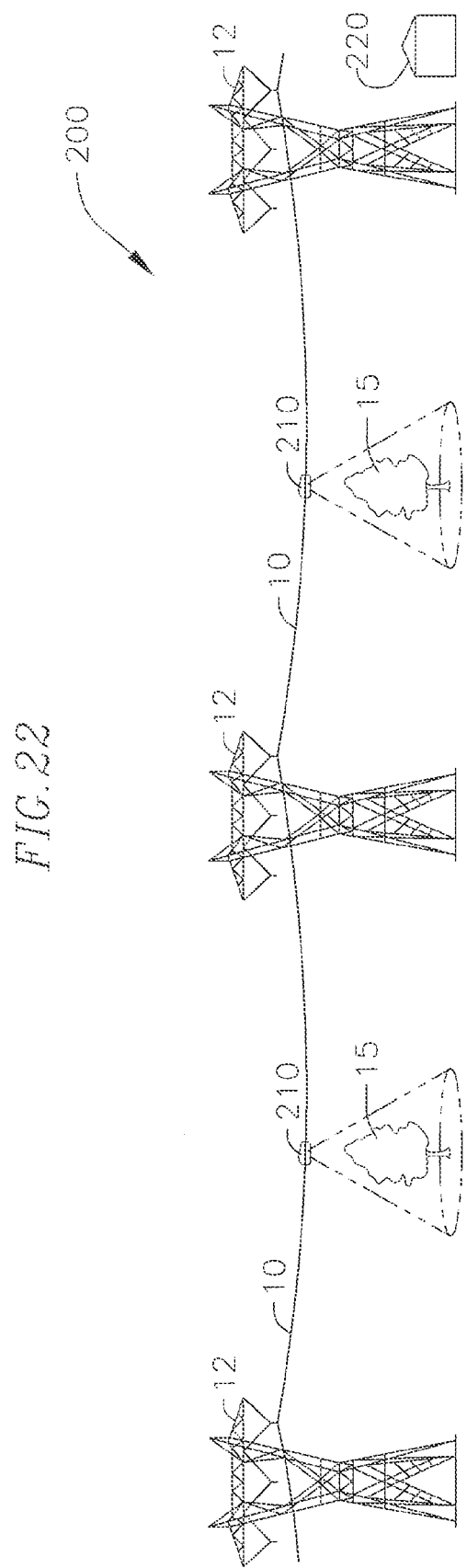
FIG. 22 is a schematic view of a dynamic real time transmission line monitoring system according to another embodiment of the present invention.

With reference to FIG. 22, a dynamic real time transmission line monitoring system 200 according to another embodiment of the present invention includes a plurality of dynamic real time transmission line monitors 210 and a monitoring station 220. Each of the dynamic real time transmission line monitors 210 may have a same or similar configuration as the dynamic real time the transmission line monitor 100 described above. In one embodiment, the transmission line monitors 210 may be installed at different locations along the same transmission line 10 that is supported by towers 12, as depicted in FIG. 22. However, the present invention is not limited thereto, and, in another embodiment, at least two of the transmission line monitors 210 may be installed on separate transmission lines 10. Each of the dynamic real time transmission line monitors 210 includes one or more sensors 110 configured to sense in real time at least one of a temperature, a position, a current, an acceleration, a vibration, a tilt, a roll, or a distance of the transmission line 10 from a nearest object 15 (e.g., a tree or the ground) below the transmission line 10. In one embodiment, the transmission line monitors 210 may be configured to send a signal containing information of a property of the transmission line 10 sensed by one or more sensors of the transmission line monitor 210 to the monitoring station 220 and/or to one another. That is, one of the transmission line monitors 210 may send a signal to another one of the transmission line monitors 210, such as a nearest one of the transmission line monitors 210. In this manner, the transmission line monitors 210 may relay signals to the monitoring station 220 across a great distance. Also, the transmission line monitors 210 may communicate information to one another. The monitoring station 220 may include a computer configured to analyze and store the information received from one or more of the transmission line monitors 210, as well as produce screen prints displaying the information. In one embodiment, each of the transmission line monitors 210 may be remotely programmable, such as via the monitoring station 220. According to another embodiment of the present invention, the dynamic real time transmission line monitoring system 200 may include only one dynamic real time transmission line monitor 210 and the monitoring station 220, and the one transmission line monitor 210 sends a signal containing information of a property of the transmission line 10 sensed by one or more sensors of the transmission line monitor 210 to the monitoring station 220.

Figure 23:
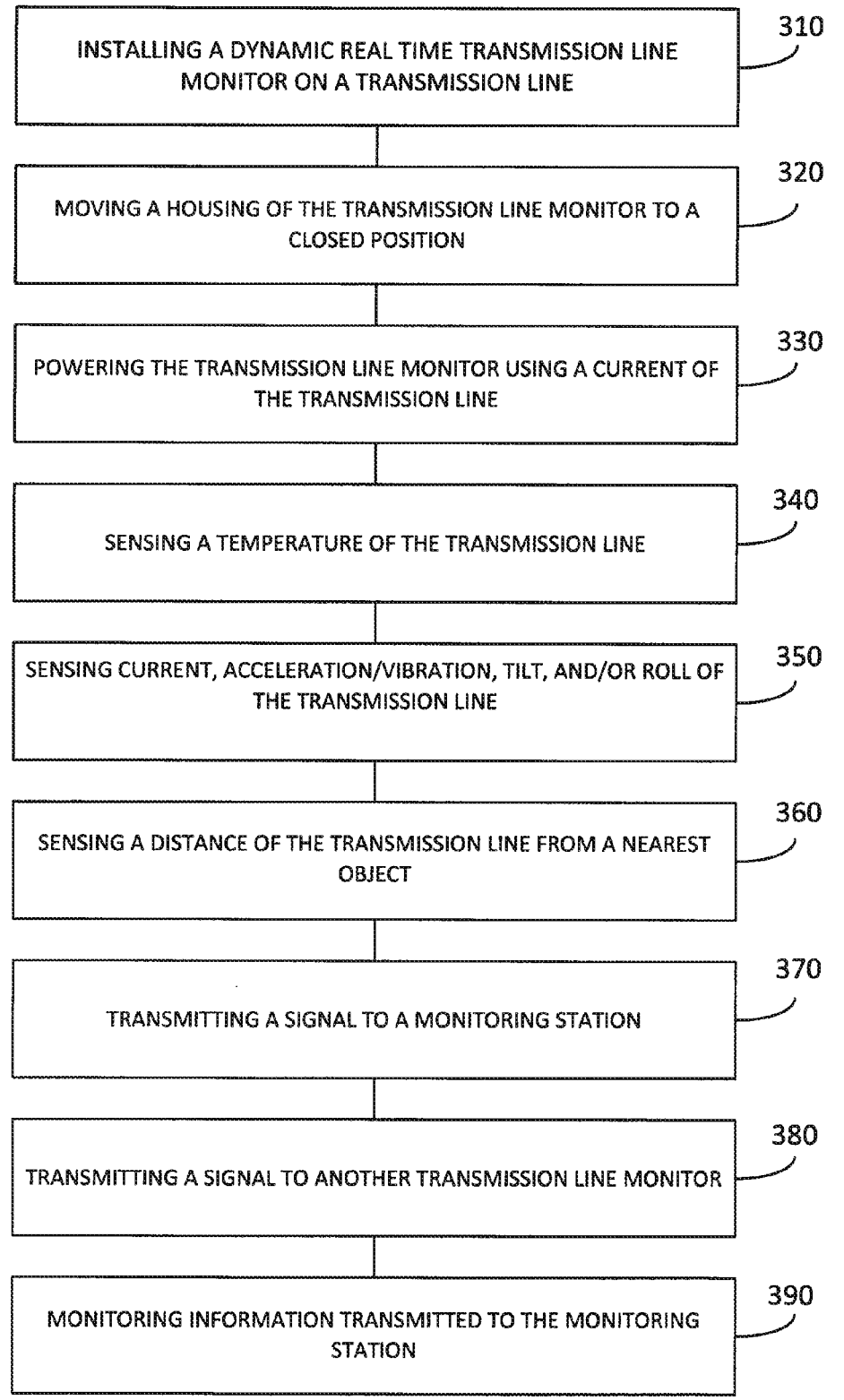
FIG. 23 is a flowchart showing tasks of a method of dynamic real time transmission line monitoring according to an embodiment of the present invention.

With reference to FIG. 23, tasks of a method 300 of dynamic real time transmission line monitoring according to an embodiment of the present invention are shown. While the method 300 is described herein with respect to the dynamic real time transmission line monitor 100 and/or the dynamic real time transmission line monitoring system 200 described above, the method 300, or at least some of the tasks thereof, may be performed using a dynamic real time transmission line monitor and/or a dynamic real time transmission line monitoring system according to other embodiments of the present invention.

In one embodiment, the method 300 of dynamic real time transmission line monitoring includes a task 310 of installing the dynamic real time transmission line monitor 100 on the transmission line 10. The transmission line monitor 100 is installed on a length of the transmission line 10 conductor, such as an aluminum conductor having a suitable diameter and voltage. For example, the transmission line 10 may be a 2-inch diameter conductor and may have a voltage of 100 kV. However, embodiments of the present invention are not limited thereto. In the task 310, the transmission line monitor 100 is installed on the transmission line 10 while the housing 102 is in the open position such that the length of the transmission line 10 is received into the cavity 104 and, more specifically, the channel 155 of the transmission line monitor 100 through the gap 108 (see FIG. 6). The transmission line monitor 100, as a result of its construction according to embodiments of the present invention, may be installed on the transmission line 10 while the transmission line 10 is live using either a bare hand or hot stick technique.

The method 300, in one embodiment, includes a task 320 of moving the housing 102 of the transmission line monitor 100 to a closed position to retain the transmission line monitor 100 on the length of the transmission line 10. In one embodiment, the task 320 includes moving at least one of the cover portion 140 or the base portion 120 relative to the other to the closed position of the housing 102 to retain the length of the transmission line 10 in the cavity 104 and, more specifically, the channel 155. In the task 320, the travel bolt 105 is turned to move at least one of the cover portion 140 or the base portion 120 relative to the other to the closed position of the housing 102. In one embodiment, the travel bolt 105 is turned further after the housing 102 is in the closed position such that the keeper 106 engages the transmission line monitor 100 on the transmission line 10. As such, the transmission line monitor 100 may be retained at a fixed position on the transmission line 10. As discussed above with respect to the task 310, the housing 102 of the transmission line monitor 100 may be moved to the closed position to retain the transmission line monitor 100 on the length of the transmission line 10 while the transmission line 10 is live using either a bare hand or hot stick technique.

The method 300, in one embodiment, includes a task 330 of powering the transmission line monitor 100 using a current of the transmission line 10. The transmission line monitor 100 may include a current transformer used to power the computer and sensors of the transmission line monitor 100 using current of the transmission line 10. As such, the transmission line monitor 100 may be self-powered via the current of the transmission line 10. In one embodiment, a current of the transmission line 10 is measured, and the current transformer may be used for measuring the current of the transmission line 10. In one embodiment, the transmission line monitor 100 includes an electronic switch which, after the transmission line monitor 100 is powered on via the current transformer and the current of the transmission line 10, switches such that the current transformer measures the current of the transmission line 10.

In one embodiment, the method 300 of dynamic real time transmission line monitoring further includes a task 340 of sensing a temperature of the transmission line 10 in real time. The temperature of the transmission line 10 is measured by the temperature sensor 114 at a location of the transmission line 10 that is in the cavity 104 and, more specifically, the channel 155 of the housing 102. The temperature sensor 114 may be a thermocouple or an infrared temperature measuring device. In one embodiment, the temperature sensor 114 measures the temperature of the temperature sensing target 195 that is in contact with the transmission line 10 such that the temperature of the temperature sensing target 195 is the same or substantially the same as a temperature of the transmission line 10. The temperature sensing target 195, in one embodiment, is anodized black and has an emissivity of one or approximately one on at least the target surface 198 at which the temperature sensor 114 measures the temperature such that an accurate temperature measurement may be obtained.

The method 300, in one embodiment, includes a task 350 of sensing vibration, acceleration, tilt, and/or roll of the transmission line 10 in real time. In one embodiment, a vibration frequency spectrum and/or a tilt and roll of the transmission line 10 is measured using the accelerometer 113, which may be a MEMS accelerometer. For example, the accelerometer 113 may measure a frequency spectrum at which the transmission line 10 is vibrating, which may be a galloping vibration or a low-amplitude aeolian vibration caused by wind which may cause fatigue in the transmission line 10.

In one embodiment, the method 300 of dynamic real time transmission line monitoring further includes a task 360 of sensing a distance of the transmission line 10 from a nearest object in real time. The transmission line monitor 100 may be used to detect and measure a distance d1 to a nearest object 15 (see FIG. 20), such as a tree, the ground, or any other object below the transmission line monitor 100. The distance d1 is measured in real time using the distance sensor 115, which may be a LIDAR sensor. For example, the distance d1 may vary in real time due to wind, precipitation, ambient temperature, or the temperature of the transmission line 10, which may cause sagging at elevated temperatures, such as caused by a high current passing through the transmission line 10.

The method 300, in one embodiment, includes a task 370 of transmitting a signal to the monitoring station 220. The signal including information sensed by the one or more sensors 110 is transmitted from the transmission line monitor 10 by the antenna 112 in real time. In one embodiment, the antenna 112 transmits a radio wave signal to the monitoring station 220. According to embodiments of the present invention, as a result of the construction of the transmission line monitor 100, the signal is effectively transmitted from the antenna 112 while a corona discharge from the antenna 112 is prevented or substantially prevented. The monitoring station 220, or control center, may be any suitable station configured to receive the signal from the antenna 112 of the transmission line monitor 100. In one embodiment, the transmission line monitor 100 may transmit a signal to more than one monitoring station 220.

The method 300, in one embodiment, includes a task 380 of transmitting a signal to another transmission line monitor. The signal including information sensed by the one or more sensors 110 is transmitted from the transmission line monitor 10 by the antenna 112 in real time. The signal, in one embodiment, is transmitted from one transmission line monitor 100 to one or more other transmission line monitors 100. For example, the signal may be transmitted from a first transmission line monitor 100 to one or more second transmission line monitors 100 installed on a same transmission line 10 as the first transmission line monitor 100 or on one or more other transmission lines 10. Each of the second transmission line monitors 100 may, in turn, transmit a signal including information sensed by the first transmission line monitor 100, as well as information sensed by the second transmission line monitor 100. In this manner, a large amount of information sensed at various locations along one or more transmission lines may be communicated over a large distance to one or more monitoring stations 220. Further, in one embodiment, the signal may be transmitted from one transmission line monitor 100 to one or more other transmission line monitors 100 and also directly to the monitoring station 220 as described above with respect to the task 370.

The method 300, in one embodiment, includes a task 390 of monitoring information transmitted to the monitoring station. As discussed above, the monitoring station 220, or control center, may be any suitable station configured to receive the signal from one or more of the transmission line monitors 100. The monitoring station 220 may also include a computer for storing and analyzing information data received from the one or more transmission line monitors 100, as well as for producing alarms and/or screen prints displaying the information, or for further processing or communicating the information to a user. In one embodiment, the real time information is received by the monitoring station 220 and monitored as the real time information itself. However, in another embodiment, the real time information received by the monitoring station 220 may be monitored or analyzed together with previously collected data, estimated parameters (e.g., estimated weather parameters), and/or day-ahead forecasts, for example.

While in one embodiment, the method 300 of dynamic real time transmission line monitoring may include each of the tasks described above and shown in FIG. 23, in other embodiments of the present invention, in a method of dynamic real time transmission line monitoring, one or more of the tasks described above and shown in FIG. 23 may be absent and/or additional tasks may be performed. Further, in the method 300 of dynamic real time transmission line monitoring according to one embodiment, the tasks may be performed in the order depicted in FIG. 23. However, the present invention is not limited thereto and, in a method of dynamic real time transmission line monitoring according to other embodiments of the present invention, the tasks described above and shown in FIG. 23 may be performed in any other suitable sequence.

According to one or more embodiments of the present invention, the transmission line monitor, when attached to the most critical spans of a transmission line (i.e. the spans with the least amount of clearance to ground) and when coupled with local weather data, can be used to calculate real time dynamic transmission line ratings using well established theory, such as IEEE 738-2012 "Standard for Calculating the Current-Temperature Relationship of Bare Overhead Conductors." By accumulating this data along with the weather predictions for each day, it is possible to build an intelligent algorithm that will forecast the maximum line rating for the next day using the next days weather forecast. In this way, using the transmission line monitor according to embodiments of the present invention, it is possible to increase or maximize the capacity of transmission line networks. In addition, if the weather forecast turns out to be incorrect, the transmission line monitor is a safety device that may send a signal to warn an operator of the transmission line system that a clearance violation is about to take place, or has already taken place. This will allow the operators to take one or more corrective actions (e.g., reducing a current through the transmission line and/or moving a load from the transmission line to one or more other transmission lines) before a clearance violation occurs.

Figure 24:
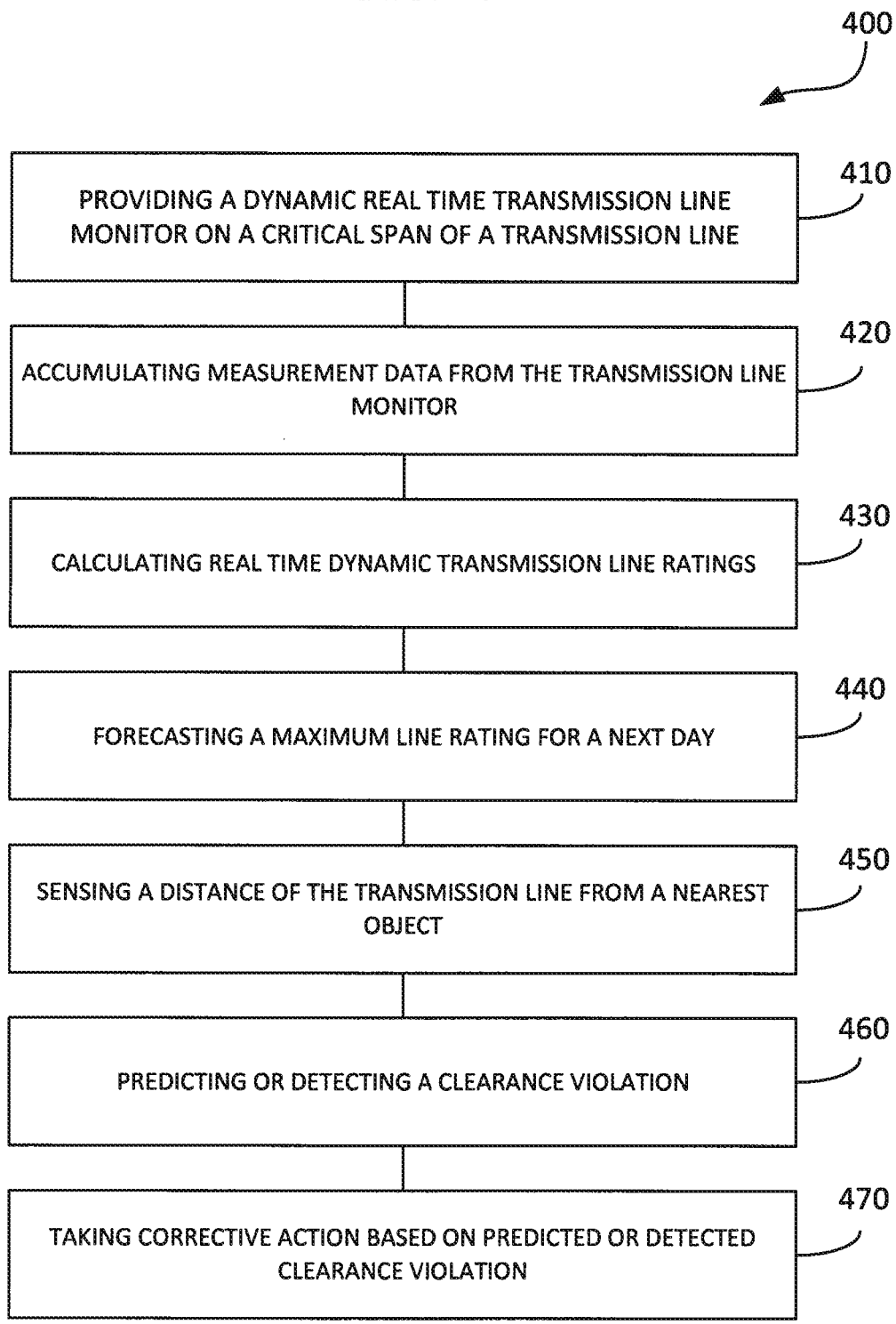
FIG. 24 is a flowchart showing tasks of a method of dynamic real time transmission line monitoring according to another embodiment of the present invention.

With reference to FIG. 24, tasks of a method 400 of dynamic real time transmission line monitoring according to an embodiment of the present invention are shown. The method 400 may be performed using the dynamic real time transmission line monitor 100 and/or the dynamic real time transmission line monitoring system 200 described above, for example, or at least some of the tasks thereof, may be performed using a dynamic real time transmission line monitor and/or a dynamic real time transmission line monitoring system according to other embodiments of the present invention. Also, one or more of the tasks of the method 400 described below may be omitted, and/or one or more additional tasks may be performed. Further, one or more of the tasks of the method 300 described above with respect to FIG. 23 may be performed together with one or more of the tasks of the method 400.

In one embodiment, the method 400 of dynamic real time transmission line monitoring includes a task 410 of providing a dynamic real time transmission line monitor on a critical span of a transmission line. For example, the dynamic real time transmission line monitor may be installed on a transmission line in a manner similar to that described above with respect to the task 310. Further, each of a plurality of dynamic real time transmission line monitors may be installed at a respective critical span, as the critical spans may vary due to changing wind or weather patterns, for example.

The method 400 further includes a task 420 of accumulating measurement data from the transmission line monitor. As described above, the transmission line monitor may sense measurement data in real time of at least one of a temperature, a position, a current, an acceleration, a vibration, a tilt, or a roll of the transmission line. That is, the transmission line monitor, using one or more sensors, may sense measurement data of ambient temperature, wind speed and direction, solar radiation, and/or other weather factors, current and temperature of the transmission line, and also a distance of the transmission line from a nearest object, as shown in a task 450. Further, a task 430 of calculating real time dynamic transmission line ratings, as described above, is performed. That is, real time dynamic transmission line ratings may be calculated using the accumulated measurement data and well established theory, such as IEEE 738-2012 "Standard for Calculating the Current-Temperature Relationship of Bare Overhead Conductors." Further, in a task 440, by accumulating the data along with the weather predictions for each day, an intelligent algorithm may be used that will forecast the maximum line rating for the next day using the next day's weather forecast together with the data of conditions accumulated from the past. The measurement data may be accumulated and analyzed by a device such as a remote computer or database server, which may be located at a monitoring station, as described above.

In the task 450, a distance of the transmission line from a nearest object is measured, and, in a task 460, the transmission line monitor may detect an actual clearance violation based on the measured distance. Also, a clearance violation may be predicted or forecasted based on the accumulated data and the algorithm. A weather forecast may also be used in predicting a clearance violation. In a task 470, if such a clearance violation is detected or predicted, a corrective action may be taken. One or more such corrective actions may include reducing a current in the transmission line or moving a load to one or more adjacent lines, for example.

Although the drawings and accompanying description illustrate some exemplary embodiments of a transmission line monitor and a method of monitoring a transmission line using the same, it will be apparent that the novel aspects of the present invention may also be carried out by utilizing alternative structures, sizes, shapes, and/or materials in embodiments of the present invention. Also, in other embodiments, components described above with respect to one embodiment may be included together with or interchanged with those of other embodiments.

The preceding description has been presented with reference to certain embodiments of the invention. Persons skilled in the art and technology to which this invention pertains will appreciate that alterations and changes in the described structures and methods of operation can be practiced without meaningfully departing from the principles, spirit, and scope of this invention.

What is claimed is:

1. A dynamic real time transmission line monitor comprising:
    a housing installable on a transmission line, the housing comprising:
        a base portion; and
        a cover portion coupled to the base portion and defining a cavity of the housing together with the base portion, at least one of the cover portion or the base portion being movable relative to the other between an open position of the housing in which a length of the transmission line is receivable in the cavity, and a closed position of the housing in which the length of the transmission line is retained in the cavity, wherein the cover portion is made from a semiconductive material, wherein a thickness of the cover portion is less than one tenth of a skin depth of the semiconductive material at which radio waves are blocked;
    a sensor supported by the housing and configured to sense in real time at least one of a temperature, a position, a current, an acceleration, a vibration, a tilt, a roll, or a distance to a nearest object; and
    an antenna in the cavity of the housing, the antenna configured to transmit a signal including information sensed by the sensor away from the monitor in real time.

2. The dynamic real time transmission line monitor of claim 1, further comprising a first alignment portion, and a second alignment portion corresponding to the first alignment portion and configured to engage the first alignment portion for aligning the cover portion on the base portion.

3. The dynamic real time transmission line monitor of claim 2, wherein the first alignment portion comprises a cone-shaped protrusion extending toward the cover portion, and the second alignment portion comprises a recess having a shape corresponding to that of the protrusion for receiving the protrusion therein.

4. The dynamic real time transmission line monitor of claim 1, wherein the dynamic real time transmission line monitor is powered by a current of the transmission line.

5. The dynamic real time transmission line monitor of claim 1, wherein the sensor comprises at least one of a LIDAR sensor, a laser sensor, a temperature sensor, or an accelerometer.

6. The dynamic real time transmission line monitor of claim 5, wherein the sensor comprises a temperature sensor, and the dynamic real time transmission line monitor further comprises a target portion in contact with the transmission line, the temperature sensor being configured to sense a temperature of the target portion.

7. A dynamic real time transmission line monitor comprising:
    a housing installable on a transmission line, the housing comprising:
        a base portion; and
        a cover portion coupled to the base portion and defining a cavity of the housing together with the base portion, at least one of the cover portion or the base portion being movable relative to the other between an open position of the housing in which a length of the transmission line is receivable in the cavity, and a closed position of the housing in which the length of the transmission line is retained in the cavity;
    a sensor supported by the housing and configured to sense in real time at least one of a temperature, a position, a current, an acceleration, a vibration, a tilt, a roll, or a distance to a nearest object; and
    an antenna in the cavity of the housing, the antenna configured to transmit a signal including information sensed by the sensor away from the monitor in real time,
    wherein the sensor comprises a temperature sensor, and the dynamic real time transmission line monitor further comprises a target portion in contact with the transmission line, the temperature sensor being configured to sense a temperature of the target portion, wherein the target portion comprises a black anodized aluminum target.

8. A dynamic real time transmission line monitor comprising:
    a housing installable on a transmission line, the housing comprising:
        a base portion; and
        a cover portion coupled to the base portion and defining a cavity of the housing together with the base portion, at least one of the cover portion or the base portion being movable relative to the other between an open position of the housing in which a length of the transmission line is receivable in the cavity, and a closed position of the housing in which the length of the transmission line is retained in the cavity;

a sensor supported by the housing and configured to sense in real time at least one of a temperature, a position, a current, an acceleration, a vibration, a tilt, a roll, or a distance to a nearest object;

an antenna in the cavity of the housing, the antenna configured to transmit a signal including information sensed by the sensor away from the monitor in real time; and a travel bolt, and a keeper portion engaged with the travel bolt and comprising a biasing mechanism biasing the housing toward the open position, the keeper portion being descendible upon rotation of the travel bolt to move the housing to the closed position, and being further descendible upon further rotation of the travel bolt to retain the transmission line after the housing is in the closed position.

9. The dynamic real time transmission line monitor of claim 1, further comprising an electronics assembly in the housing and being configured to receive the information from the sensor and cause the antenna to transmit the signal including the information.

10. A dynamic real time transmission line monitoring system comprising:
    a dynamic real time transmission line monitor comprising:
        a housing installable on a transmission line and comprising a base portion and a cover portion coupled to the base portion and defining a cavity of the housing together with the base portion, wherein the cover portion is made from a semiconductive material, wherein a thickness of the cover portion is less than one tenth of a skin depth of the semiconductive material at which radio waves are blocked;
        a sensor configured to sense in real time at least one of a temperature, a position, a current, an acceleration, a vibration, a tilt, a roll, or a distance to a nearest object; and
        an antenna in the cavity of the housing, the antenna configured to transmit a signal including information sensed by the sensor away from the monitor in real time; and
    a remote receiving device receiving the signal from the dynamic real time transmission line monitor.

11. The dynamic real time transmission line monitoring system of claim 10, wherein the remote receiving device comprises at least one of a monitoring station or another dynamic real time transmission line monitor.

12. The dynamic real time transmission line monitoring system of claim 10, wherein the remote receiving device comprises a computer to accumulate data from the sensor and to calculate real time dynamic transmission line ratings of a critical span of the transmission line using the data accumulated from the sensor, local weather data, and an established algorithm.

13. A dynamic real time transmission line monitoring system comprising:
    a dynamic real time transmission line monitor comprising:
        a housing installable on a transmission line and comprising a base portion and a cover portion coupled to the base portion and defining a cavity of the housing together with the base portion;
        a sensor configured to sense in real time at least one of a temperature, a position, a current, an acceleration, a vibration, a tilt, a roll, or a distance to a nearest object; and
        an antenna in the cavity of the housing, the antenna configured to transmit a signal including information sensed by the sensor away from the monitor in real time; and
    a remote receiving device receiving the signal from the dynamic real time transmission line monitor,
    wherein the remote receiving device comprises a computer to accumulate data from the sensor and to calculate real time dynamic transmission line ratings of a critical span of the transmission line using the data accumulated from the sensor, local weather data, and an established algorithm, wherein the computer calculates a maximum line rating of the transmission line for a next day using the accumulated data and a weather prediction for the next day.

14. The dynamic real time transmission line monitoring system of claim 12, wherein the system is configured to take a corrective action based on at least one of the sensed distance to the nearest object or the calculated real time dynamic transmission line ratings.

15. A method of dynamic real time transmission line monitoring, the method comprising:
    providing a dynamic real time transmission line monitor on a transmission line, the dynamic real time transmission line monitor including a housing including a base portion and a cover portion coupled to the base portion and defining a cavity of the housing together with the base portion, and an antenna in the cavity of the housing, wherein the cover portion is made from a semiconductive material, wherein a thickness of the cover portion is less than one tenth of a skin depth of the semiconductive material at which radio waves are blocked;
    sensing in real time at least one of a temperature, a position, a current, an acceleration, a vibration, a tilt, a roll, or a distance to a nearest object using a sensor of the dynamic real time transmission line monitor; and
    transmitting a signal including information sensed using the sensor to a remote receiving device in real time via the antenna.

16. The method of claim 15, wherein the providing the dynamic real time transmission line monitor on the transmission line comprises installing the dynamic real time transmission line monitor on the transmission line while the transmission line is live.

17. The method of claim 16, wherein the installing the dynamic real time transmission line monitor on the transmission line further comprises installing the dynamic real time transmission line monitor on the transmission line using a hot stick or bare hand.

18. The method of claim 16, wherein at least one of the cover portion or the base portion is movable relative to the other between an open position of the housing in which the cover portion and the base portion are spaced apart, and a closed position of the housing, and wherein the installing the dynamic real time transmission line monitor on the transmission line comprises:
    inserting a length of the transmission line between the cover portion and the base portion into the cavity while the housing is in the open position; and moving the at least one of the cover portion or the base portion relative to the other to the closed position to retain the length of the transmission line in the cavity.

19. The method of claim 15, wherein the sensor comprises at least one of a LIDAR sensor, a laser sensor, a temperature sensor, or an accelerometer.

20. The method of claim 15, wherein the remote receiving device comprises at least one of a monitoring station or another dynamic real time transmission line monitor.

21. The method of claim 15,
wherein the providing the dynamic real time transmission line monitor on the transmission line comprises providing the dynamic real time transmission line monitor on a critical span of the transmission line, and
wherein the method further comprises calculating real time dynamic transmission line ratings using local weather data and an established algorithm.

22. A method of dynamic real time transmission line monitoring, the method comprising:
providing a dynamic real time transmission line monitor on a transmission line, the dynamic real time transmission line monitor including a housing including a base portion and a cover portion coupled to the base portion and defining a cavity of the housing together with the base portion, and an antenna in the cavity of the housing;
sensing in real time at least one of a temperature, a position, a current, an acceleration, a vibration, a tilt, a roll, or a distance to a nearest object using a sensor of the dynamic real time transmission line monitor; and
transmitting a signal including information sensed using the sensor to a remote receiving device in real time via the antenna,
wherein the providing the dynamic real time transmission line monitor on the transmission line comprises providing the dynamic real time transmission line monitor on a critical span of the transmission line, and
wherein the method further comprises:
calculating real time dynamic transmission line ratings using local weather data and an established algorithm; and
calculating a maximum line rating of the transmission line for a next day using data measured by the dynamic real time transmission line monitor and a weather prediction for the next day.

23. The method of claim 21, further comprising taking a corrective action based on at least one of the sensed distance to the nearest object or the calculated real time dynamic transmission line ratings.

24. The dynamic real time transmission line monitor of claim 1, wherein the cover portion is coupled to the base portion via a single travel bolt, and the at least one of the cover portion or the base portion is movable relative to the other between the open position of the housing and the closed position of the housing by rotation of the single travel bolt.

25. The dynamic real time transmission line monitor of claim 1, wherein the sensor is configured to sense in real time at least one of a position, a current, or a distance to a nearest object.

26. The dynamic real time transmission line monitoring system of claim 10, wherein the sensor is configured to sense in real time at least one of a position, a current, or a distance to a nearest object.

27. The method of claim 15, wherein the providing the dynamic real time transmission line monitor on the transmission line comprises installing the dynamic real time transmission line monitor on the transmission line by rotating a single travel bolt coupled between the base portion and the cover portion.

28. The method of claim 15, wherein the sensing in real time comprises sensing at least one of a position, a current, or a distance to a nearest object.

29. A dynamic real time transmission line monitor comprising:
a housing installable on a transmission line, the housing comprising:
a base portion; and
a cover portion coupled to the base portion and defining a cavity of the housing together with the base portion, at least one of the cover portion or the base portion being movable relative to the other between an open position of the housing in which a length of the transmission line is receivable in the cavity, and a closed position of the housing in which the length of the transmission line is retained in the cavity, wherein the cover portion is made from a semiconductive material, wherein the semiconductive material has a resistivity of about 10 to 20 kohm/cm$^2$;
a sensor supported by the housing and configured to sense in real time at least one of a temperature, a position, a current, an acceleration, a vibration, a tilt, a roll, or a distance to a nearest object; and
an antenna in the cavity of the housing, the antenna configured to transmit a signal including information sensed by the sensor away from the monitor in real time.

30. The dynamic real time transmission line monitor of claim 1, wherein the thickness of the cover portion is about 0.125 inches.

31. The dynamic real time transmission line monitor of claim 1, wherein the antenna is housed entirely in the cavity of the housing.

32. The dynamic real time transmission line monitoring system of claim 10, wherein the antenna is housed entirely in the cavity of the housing.

33. The method of claim 15, wherein the antenna is housed entirely in the cavity of the housing.

* * * * *